(12) United States Patent
DeDontney

(10) Patent No.: US 8,746,284 B2
(45) Date of Patent: Jun. 10, 2014

(54) APPARATUS AND METHOD FOR MULTIPLE SYMMETRICAL DIVISIONAL GAS DISTRIBUTION

(75) Inventor: Jay DeDontney, Prunedale, CA (US)

(73) Assignee: Intermolecular, Inc., San Jose, CA (US)

( * ) Notice: Subject to any disclaimer, the term of this patent is extended or adjusted under 35 U.S.C. 154(b) by 521 days.

(21) Appl. No.: 13/105,225

(22) Filed: May 11, 2011

(65) Prior Publication Data
US 2012/0289057 A1    Nov. 15, 2012

(51) Int. Cl.
*F16K 11/20* (2006.01)
*C23C 16/455* (2006.01)

(52) U.S. Cl.
CPC .................. *C23C 16/45561* (2013.01)
USPC ........................... 137/884; 118/715

(58) Field of Classification Search
CPC ................................. C23C 16/45561
USPC .......................... 137/884; 118/715
See application file for complete search history.

(56) References Cited

U.S. PATENT DOCUMENTS

| | | | | |
|---|---|---|---|---|
| 5,605,179 A | * | 2/1997 | Strong et al. ................ | 137/884 |
| 6,102,068 A | * | 8/2000 | Higdon et al. .............. | 137/341 |
| 6,648,021 B2 | * | 11/2003 | Zheng et al. ................ | 137/884 |
| 7,032,614 B2 | * | 4/2006 | Lappen et al. .............. | 137/312 |
| 7,055,550 B2 | * | 6/2006 | Harris et al. ................ | 137/884 |
| 7,677,265 B2 | * | 3/2010 | Shikata et al. .............. | 137/341 |
| 7,833,352 B2 | * | 11/2010 | Bondestam et al. ......... | 118/725 |
| 7,896,031 B2 | * | 3/2011 | Eriksson et al. ............ | 137/884 |
| 8,104,516 B2 | * | 1/2012 | Moriya et al. .............. | 137/884 |
| 2009/0061083 A1 | | 3/2009 | Chiang et al. | |
| 2009/0275210 A1 | | 11/2009 | Shanker et al. | |

* cited by examiner

*Primary Examiner* — John Fox

(57) ABSTRACT

An apparatus and method for multiple symmetrical divisional gas distribution providing a mounting plate, a plurality of manifolds coupled to the mounting plate, a center purge block coupled to the mounting plate and the plurality of manifolds, a plurality of reactant distribution blocks, wherein each reactant distribution block is stacked atop each other to form a reactant distribution block stack, wherein the reactant distribution block stack sits atop the center purge block, a coupling mechanism to secure the plurality of reactant distribution blocks of the reactant distribution block stack together; and a top cap coupled to the reactant distribution block stack and the coupling mechanism.

13 Claims, 24 Drawing Sheets

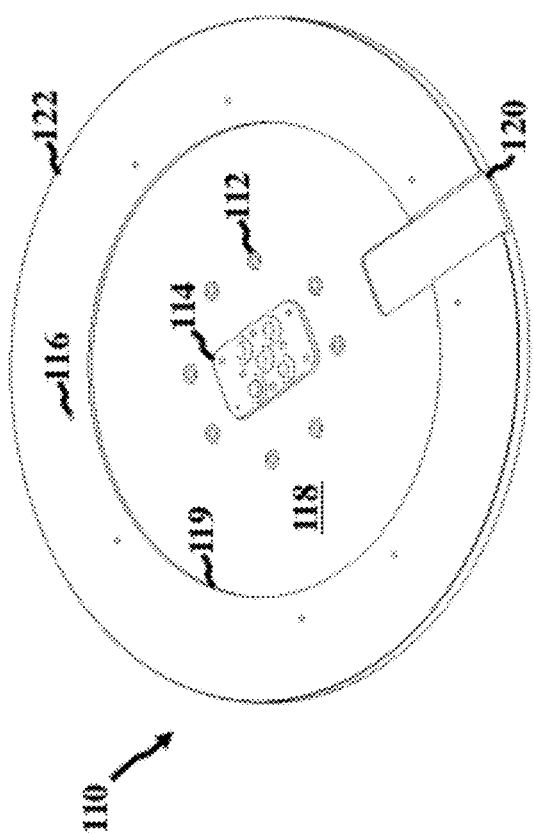

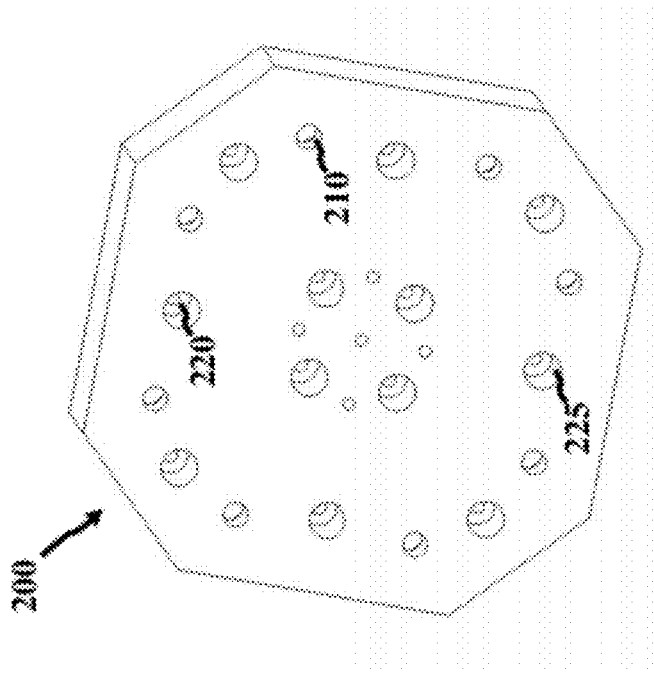
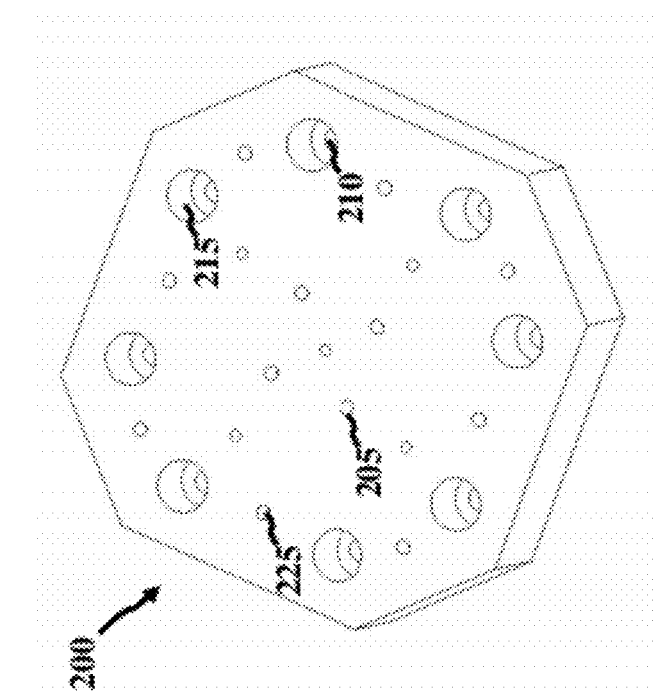

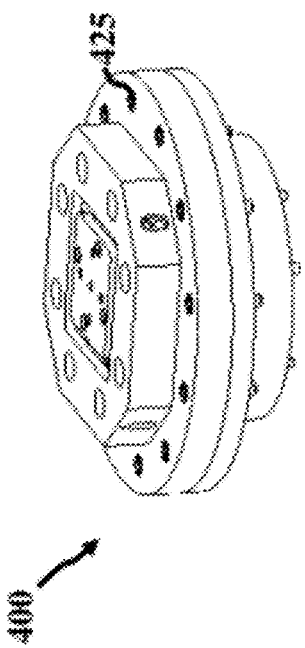

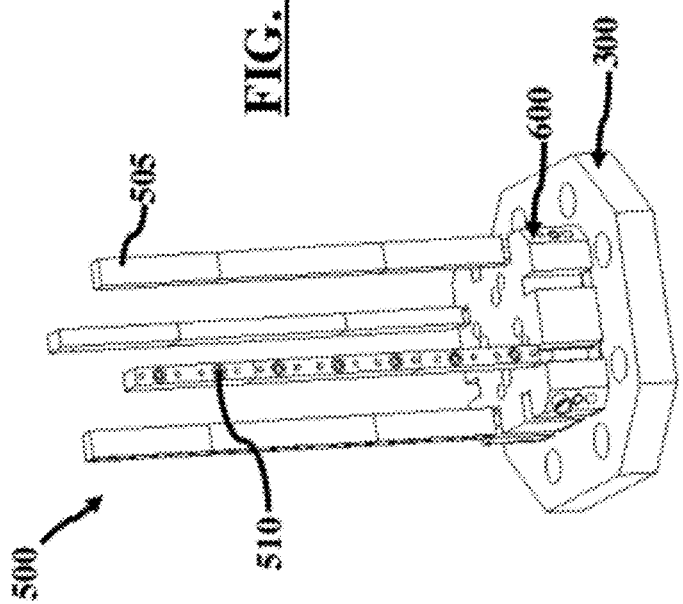
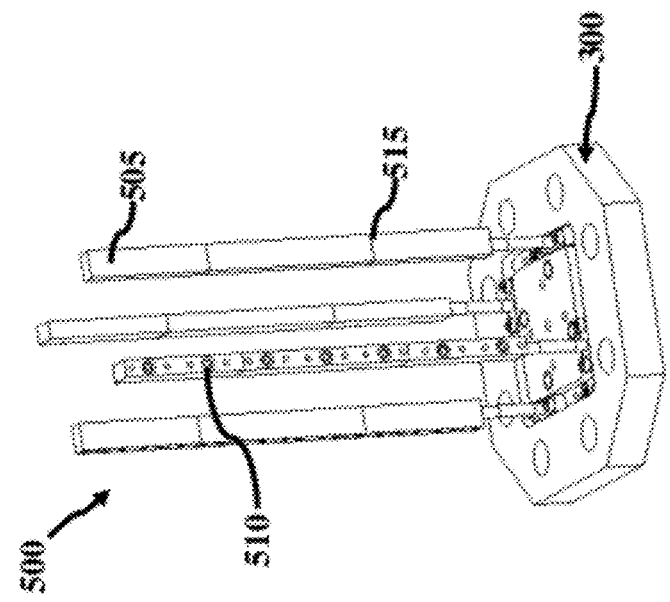

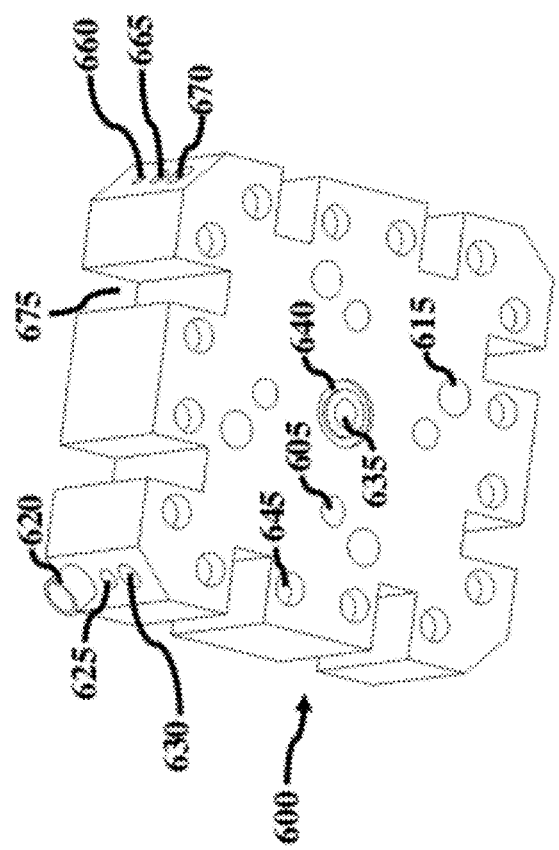
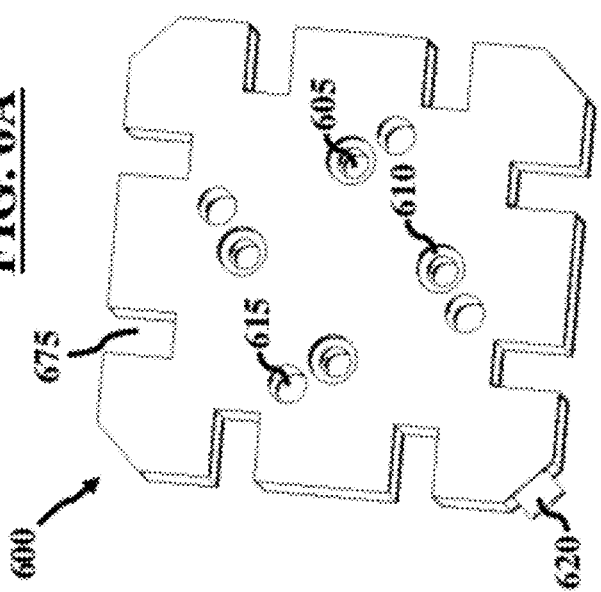
FIG. 6B
FIG. 6A

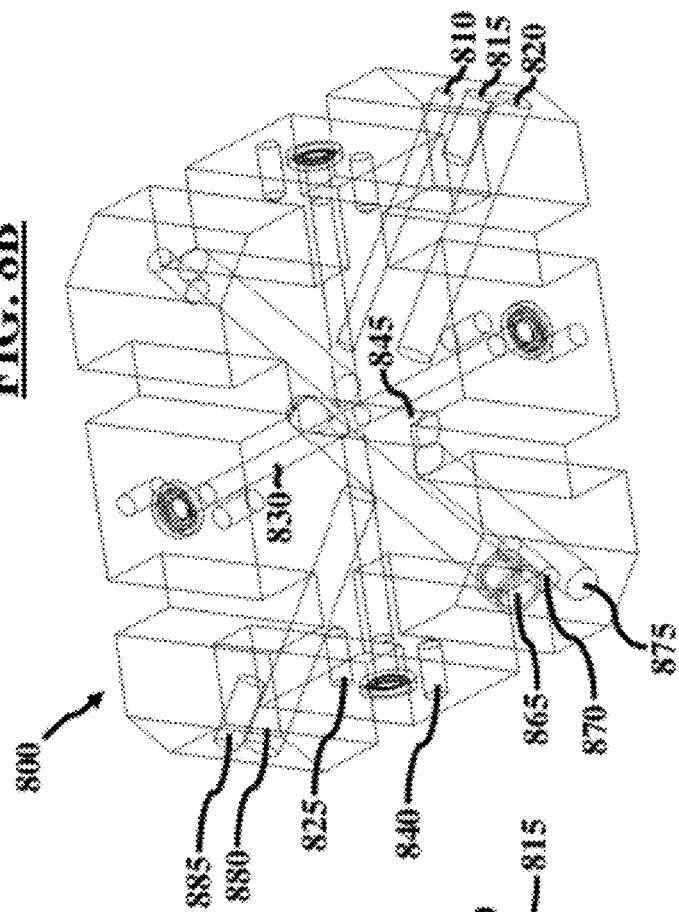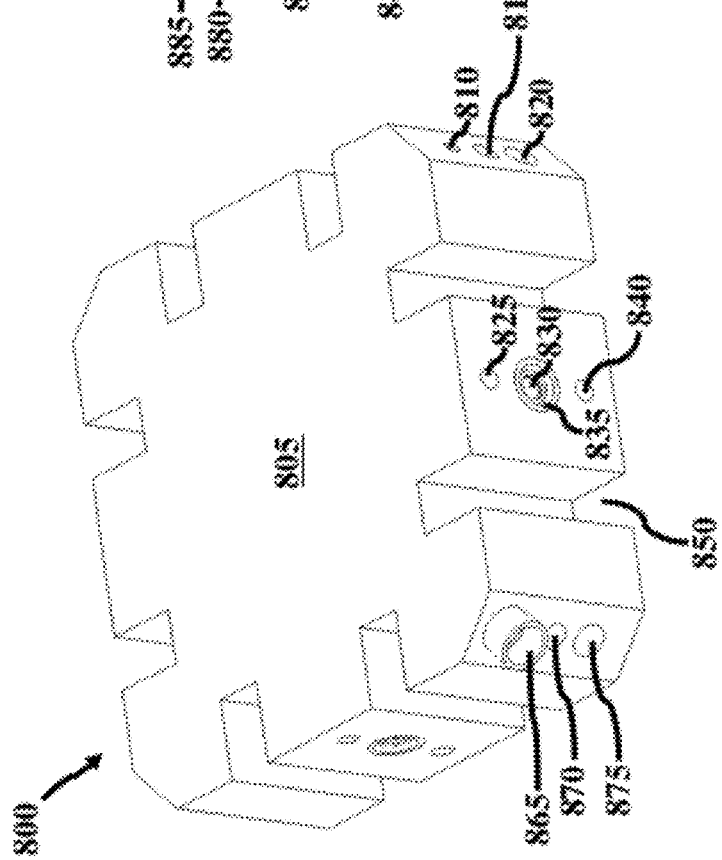

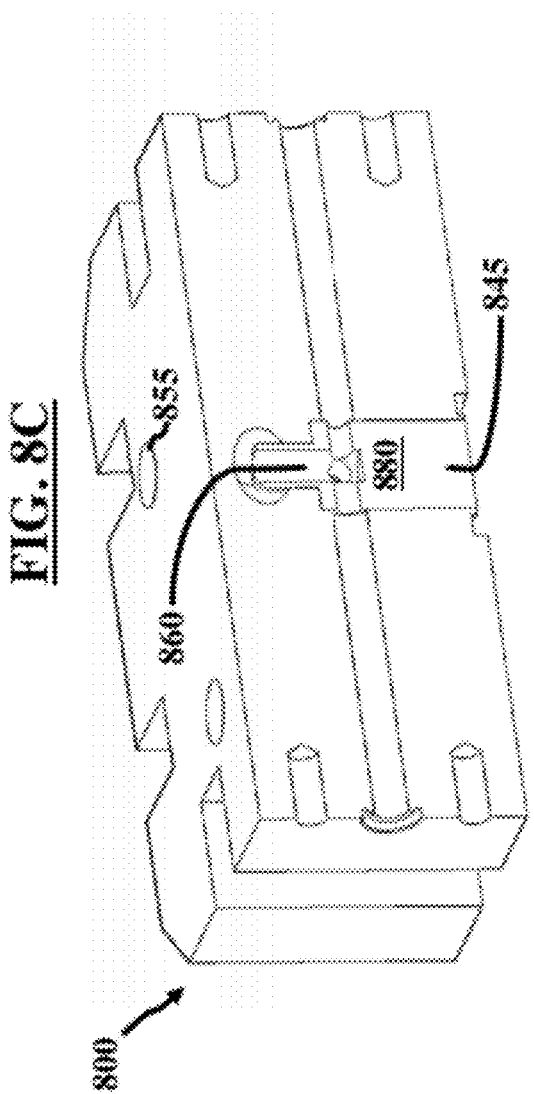

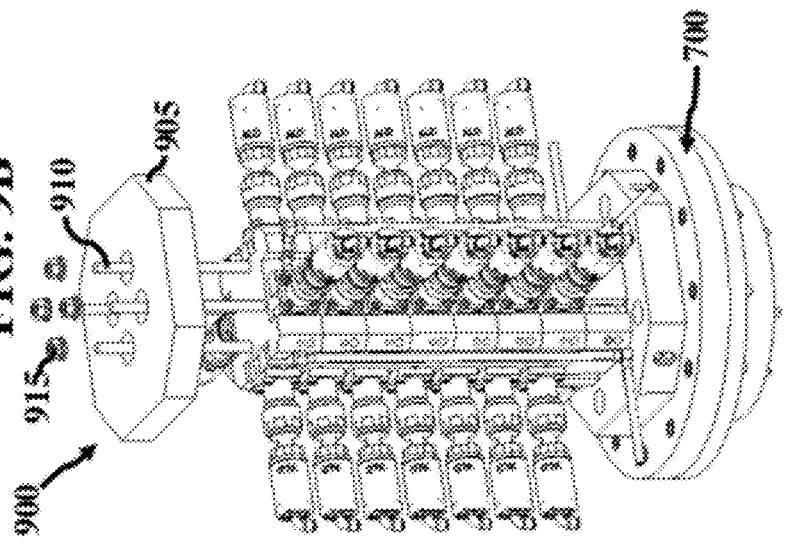
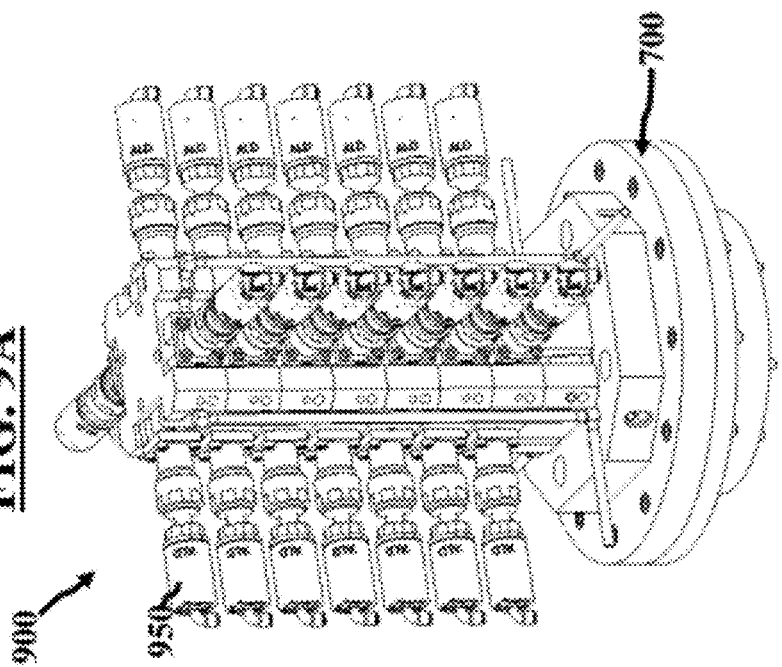

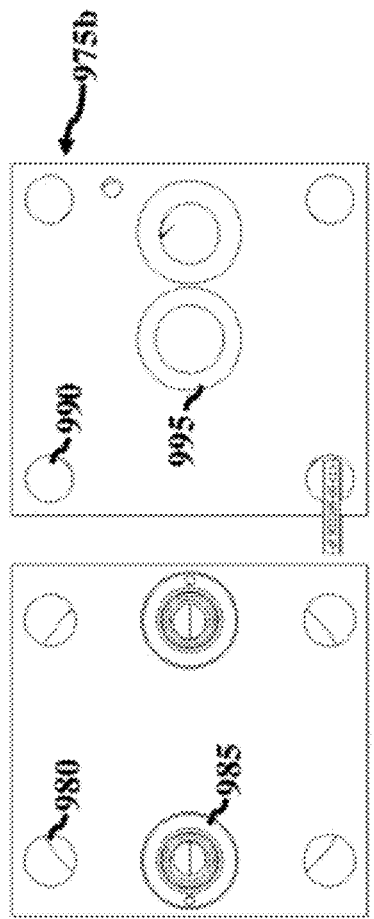
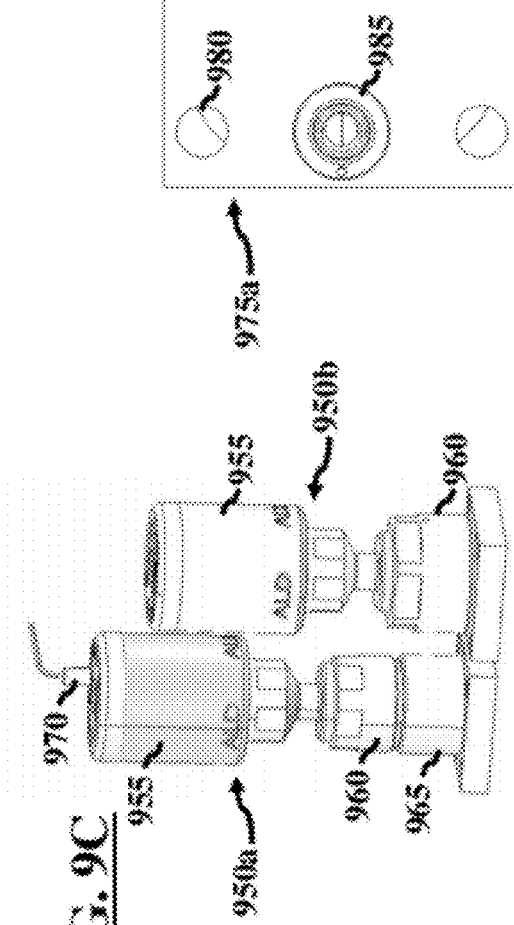

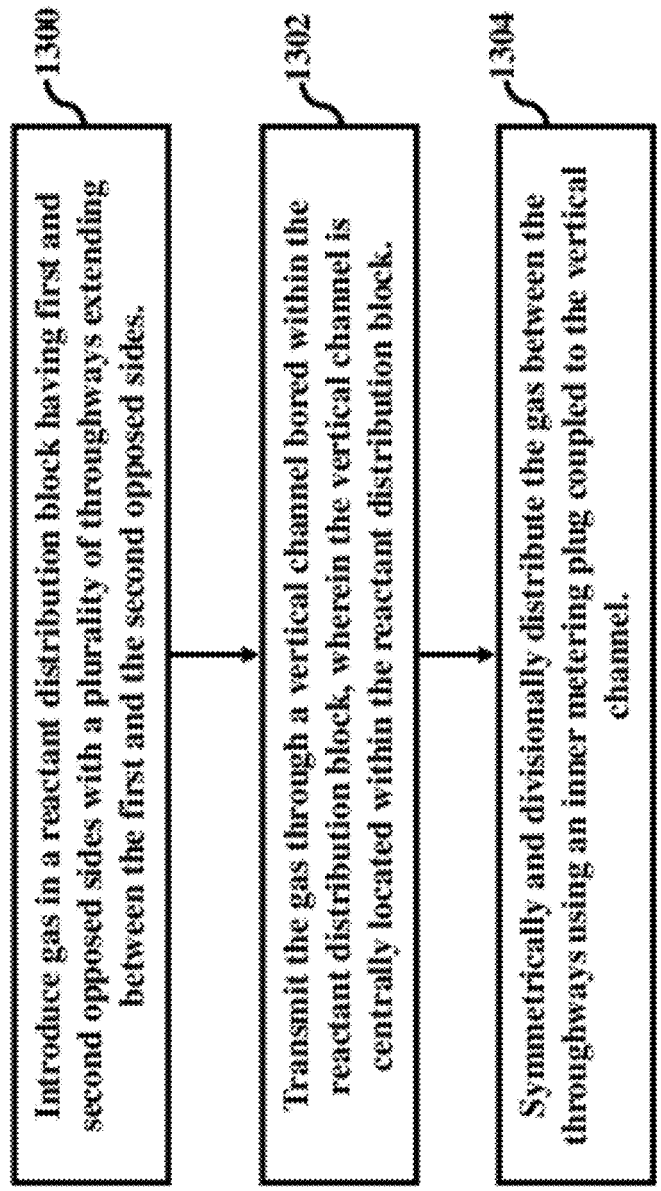

APPARATUS AND METHOD FOR MULTIPLE SYMMETRICAL DIVISIONAL GAS DISTRIBUTION

BACKGROUND

1. Technical Field

The embodiments herein generally relate to semiconductor processing, and, more particularly, to a system and method of gas distribution in semiconductor processing.

2. Description of the Related Art

Chemical Vapor Deposition (CVD) is a vapor based deposition process commonly used to deposit layers of material in a semiconductor manufacturing process. For example, CVD is used for the formation of dielectric layers, conductive layers, semiconducting layers, liners, barriers, adhesion layers, seed layers, stress layers, and fill layers. CVD is typically a thermally driven process whereby a deposition material (e.g., precursor flux) is pre-mixed and tailored to the substrate surface that the deposition material will be deposited upon. CVD requires control of the substrate temperature and the incoming deposition material to achieve desired film material properties and thickness uniformity. Derivatives of CVD based processes include but are not limited to Plasma Enhanced Chemical Vapor Deposition (PECVD), High-Density Plasma Chemical Vapor Deposition (HDP-CVD), Sub-Atmospheric Chemical Vapor Deposition (SACVD), laser assisted/induced CVD, and ion assisted/induced CVD.

As device geometries shrink and associated film thickness decrease, there is an increasing need for improved control of the deposited layers. A variant of CVD that enables superior step coverage, materials property, and film thickness control is a sequential deposition technique known as Atomic Layer Deposition (ALD). ALD is a multi-step, self-limiting process that includes the use of at least two deposition materials (e.g., precursor fluxes or reagents). Generally, a first deposition material is introduced into a processing chamber containing a substrate and adsorbs on the surface of the substrate. The excess first deposition material is purged and/or pumped away. A second deposition material is then introduced into the chamber and reacts with the initially adsorbed layer to form a deposited layer via a deposition reaction. The deposition reaction is self-limiting in that the reaction terminates once the initially adsorbed layer is consumed by the second deposition material. The excess second deposition material is purged and/or pumped away. The aforementioned steps constitute one deposition or ALD "cycle." The process is repeated to form the next layer, with the number of cycles determining the total deposited film thickness. Different sets of deposition materials can also be chosen to form nano-composites comprised of differing material compositions. Derivatives of ALD include but are not limited to Plasma Enhanced Atomic Layer Deposition (PEALD), radical assisted/enhanced ALD, laser assisted/induced ALD, and ion assisted/induced ALD.

Presently, conventional vapor-based processes such as CVD and ALD are designed to process uniformly across a full wafer. The ability to process uniformly across a monolithic substrate and/or across a series of monolithic substrates is advantageous for manufacturing efficiency and cost effectiveness, as well as repeatability and control. However, uniform processing across an entire substrate can be disadvantageous when optimizing, qualifying, or investigating new materials, new processes, and/or new process sequence integration schemes, since the entire substrate is nominally made the same using the same materials, processes, and process sequence integration scheme.

In conventional processing systems, when optimizing, qualifying, or investigating new materials, new processes, and/or new process sequence integration schemes, a combinatorial approach may be taken where each processed substrate generally represents, in essence, only one possible variation per substrate. For examples, in a conventional combinatorial approach, numerous material compositions may be systematically explored during a screening process, and the results of this screening process are used to filter materials into subsequent screening processes. With only one possible variation per substrate, however, fewer data points per substrate are gathered resulting in longer times to accumulate a wide variety of data and higher costs associated with obtaining such data. Moreover, when conventional systems simply try to add more than one possible variation to a substrate, conventional deposition material distribution systems are unable to evenly deliver and deposit the different materials to a single substrate. What is needed, therefore, is a symmetrical distribution system that can distribute multiple deposition gases to specific sections on a substrate.

BRIEF DESCRIPTION OF THE DRAWINGS

The embodiments herein will be better understood from the following detailed description with reference to the drawings, in which:

FIG. 1F illustrates a schematic diagram of a backing plate according to an embodiment herein;

FIG. 2A illustrates a top perspective view of an insulator according to an embodiment herein;

FIG. 2B illustrates a bottom perspective view of an insulator according to an embodiment herein;

FIG. 4C illustrates a schematic diagram of an insulator/mounting plate sub-assembly according to an embodiment herein;

FIG. 5A illustrates an assembly view of manifold/mounting plate sub-assembly according to an embodiment herein;

FIG. 5B illustrates an assembly view of a manifold/center purge block/mounting plate sub-assembly according to an embodiment herein;

FIG. 6A illustrates a top view of a center purge block according to an embodiment herein;

FIG. 6B illustrates a bottom perspective view of a center purge block according to an embodiment herein;

FIG. 8A illustrates a top perspective view of a reactant distribution block according to an embodiment herein;

FIG. 8B illustrates a transparent top perspective view of a reactant distribution block according to an embodiment herein;

FIG. 8C illustrates cross-sectional view of a reactant distribution block according to an embodiment herein;

FIG. 9A illustrates a distribution stack sub-assembly with valves according to an embodiment herein;

FIG. 9B illustrates an exploded view of a secured distribution stack sub-assembly with valves according to an embodiment herein;

FIG. 9C illustrates a schematic diagram of valves according to an embodiment herein;

FIG. 9D illustrates a schematic diagram of valve mounting plates according to an embodiment herein;

FIG. 12 is a flow diagram illustrating a method according to an embodiment herein.

DETAILED DESCRIPTION

Figure 1A:
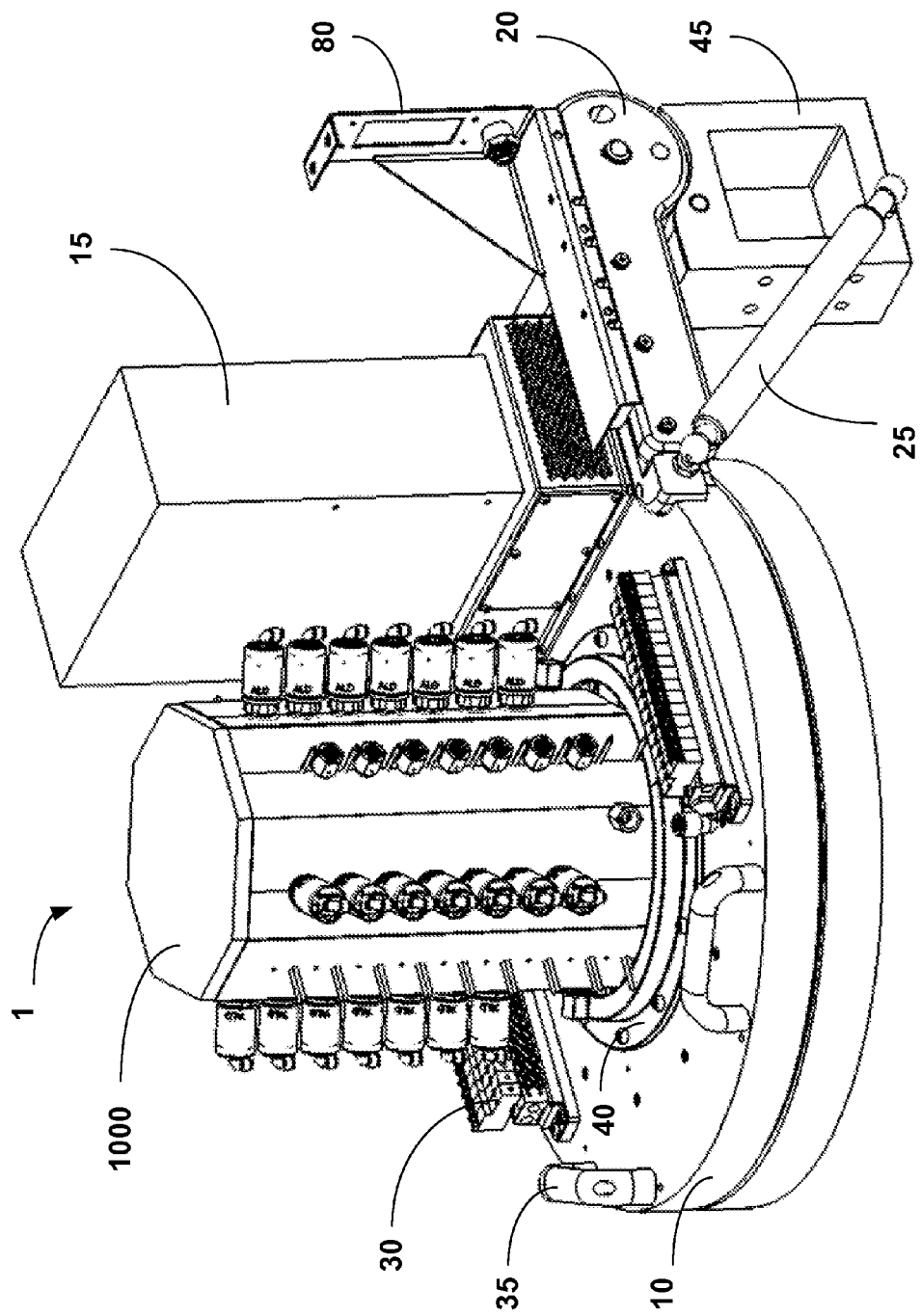
FIG. 1A illustrates a perspective view of a symmetrically divisional gas distribution system according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a symmetrical gas distribution system. For example, according to one embodiment herein, two discretely independent gas paths (per quadrant or N-divisions used) prevent pre-reaction of chemistry within the delivery plumbing. In general, a modular design permits stacking of manifolds to support 1 to N number of discrete input gases (N being an integer). Moreover, each gas can be routed to 1 of 2 separate paths to any quadrant selected. The symmetrically radial design according to one embodiment herein converts a large number of individually designed gas line heater jackets on gas lines to simple, inexpensive cartridge heaters embedded within manifold blocks, thereby improving reliability, thermal uniformity and reducing cost. Moreover, according to the embodiments herein, high temperature valves are oriented symmetrically permitting optimum cooling of valve actuators. Referring now to the drawings, and more particularly to FIGS. 1A through 12, where similar reference characters denote corresponding features consistently throughout the figures, there are shown different embodiments.

Figure 1B:
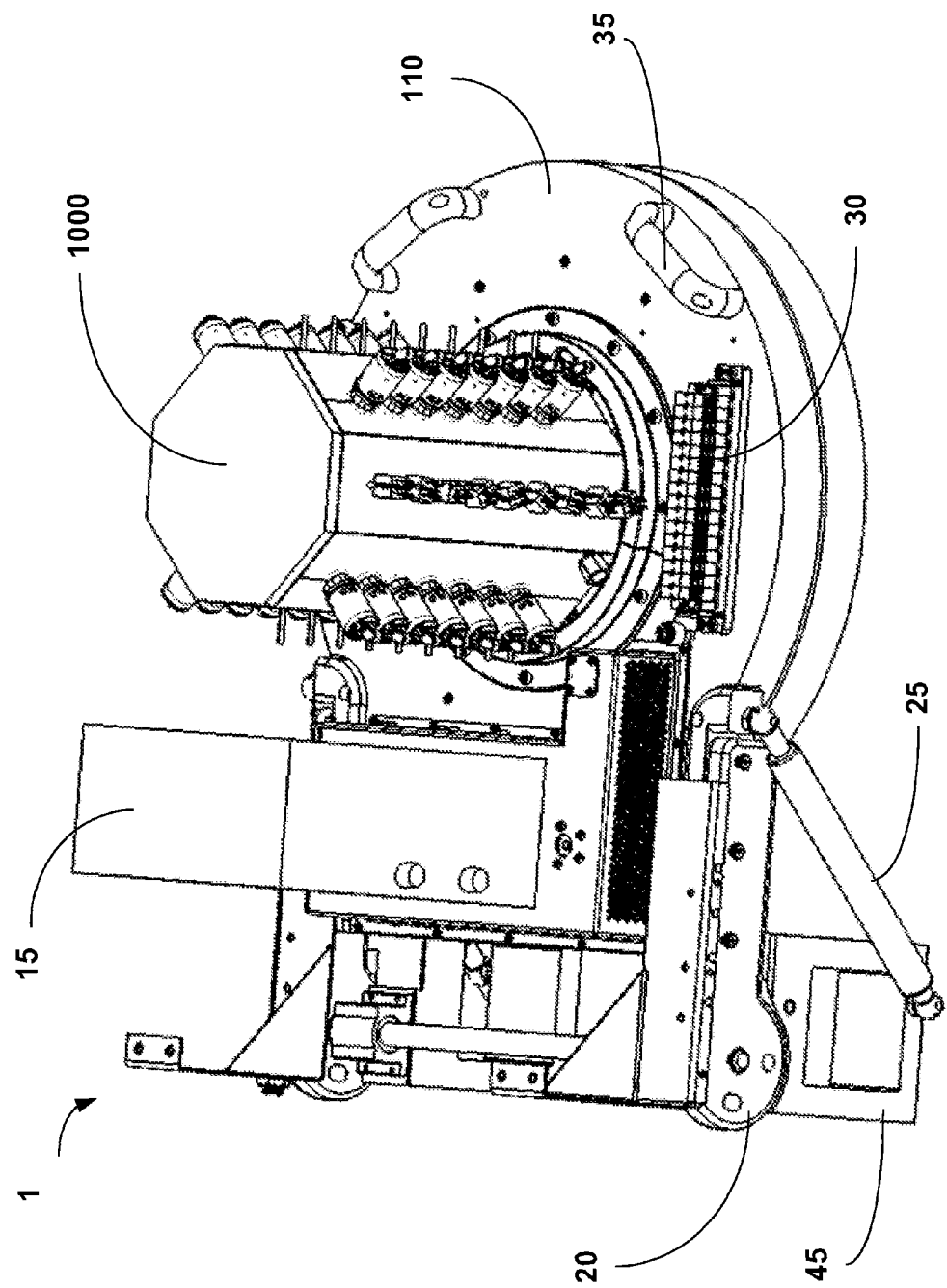
FIG. 1B illustrates a partially transparent perspective view of the symmetrically divisional gas distribution system of FIG. 1A according to an embodiment herein.
Figure 1C:
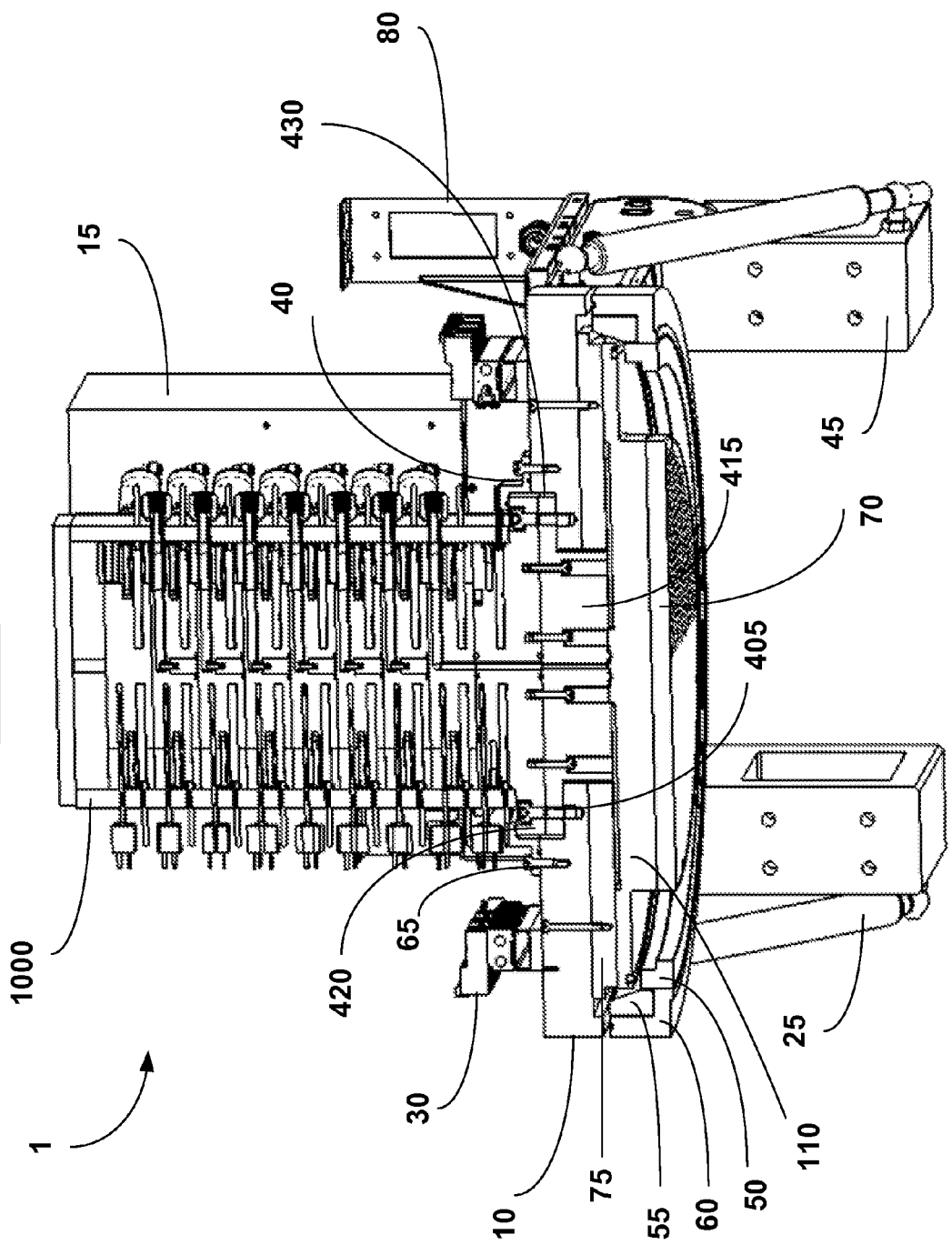
FIG. 1C illustrates a cross-sectional view of the symmetrically divisional gas distribution system of FIGS. 1A and 1B according to an embodiment herein.

FIG. 1A illustrates a perspective view of a symmetrically divisional gas distribution system 1 according to an embodiment herein. Moreover, FIG. 1B illustrates a partially transparent perspective view of the symmetrically divisional gas distribution system 1, and FIG. 1C illustrates a cross-sectional view of the symmetrically divisional gas distribution system 1 according to an embodiment herein. As shown in FIG. 1A, the symmetrically divisional gas distribution system 1 includes a lid 10, an RF match assembly 15, a pivot arm 20, gas assist struts 25, pneumatic valve actuator assemblies 30, handles 35, mounting plate cover 40, anchor block 45, and insulated distribution apparatus 1000. According to the embodiment shown in FIG. 1A, pivot arm 20 and struts 25 assist in lifting lid 10, RF match assembly 15, and insulated distributed apparatus 1000.

In FIG. 1B, lid 10 is illustrated to be transparent to show the components hidden thereunder. In particular, FIG. 1B shows backing plate 110. As shown in FIG. 1C, backing plate 110 is coupled to a showerhead 70, where showerhead 70 is, for example, inside a thin film deposition chamber (not shown). In addition, lid 10 includes an insulator top 75, a first ring insulator 50 and a second ring insulator 55 as well as an outer ring 60 to properly seal and insulate a thin film deposition chamber (not shown). According to one embodiment herein, first ring insulator 50 is a ceramic insulator and second ring insulator 55 comprises a Teflon® insulator available from DuPont, Del., USA. Other embodiments herein also support the use of a ceramic insulator for either first ring insulator 50 and second ring insulator 55. While not shown in FIG. 1C, according to one embodiment herein, symmetrically divisional gas distribution system 1 forms a lid sub-assembly to an ALD system (not shown), where lid 10 seals an ALD chamber (not shown) prior to the ALD processing of a substrate. In addition, backing plate 110 is coupled to an insulator plate 430 and insulator plate 430 is coupled to a mounting plate 420. According to the embodiment shown in FIG. 1C, a plurality of outer mounting screws 405 couple mounting plate 420 and insulator plate 430 to lid 10. In addition, a plurality of bottom screws 415 couple insulator plate 430 to mounting plate 420. FIG. 1C also illustrates a plurality of cover screws 65 coupling mounting plate cover 40 to lid 10, electrically connecting mounting plate 420 to lid 10.

While FIGS. 1A through 1C illustrate a schematic diagram of symmetrically divisional gas distribution system 1, the embodiments herein are not limited to what is shown in FIGS. 1A through 1C. For example, FIG. 1D, with reference to FIGS. 1A through 1C, illustrates a schematic diagram of a single port symmetrically divisional gas distribution apparatus 100 according to an embodiment herein. Additionally, FIG. 1E, with reference to FIGS. 1A through 1D, illustrates a schematic diagram of a dual port symmetrically divisional gas distribution apparatus 150 according to an embodiment herein. While not shown in FIGS. 1D and 1E, single port symmetrically divisional gas distribution apparatus 100 and dual port symmetrically divisional gas distribution apparatus 150 are each interoperable with of symmetrically divisional gas distribution system 1. For example, according to one embodiment herein, insulated distribution apparatus 1000 (shown in FIG. 1A) includes at least one of single port symmetrically divisional gas distribution apparatus 100 and dual port symmetrically divisional gas distribution apparatus 150.

Figure 1E:
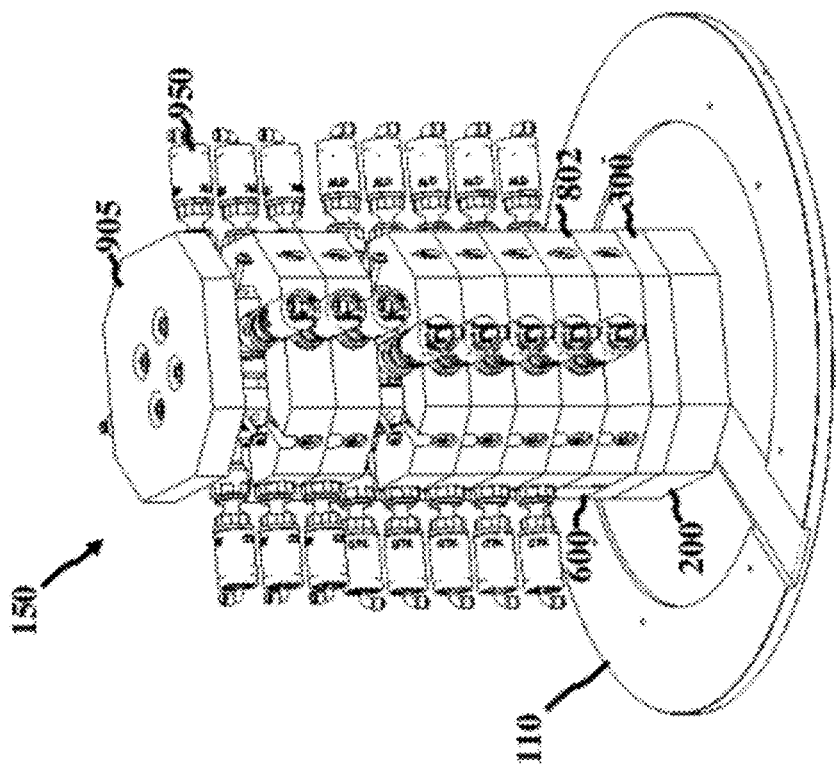
FIG. 1E illustrates a schematic diagram of a dual port symmetrically divisional gas distribution apparatus according to an embodiment herein.
Figure 1D:
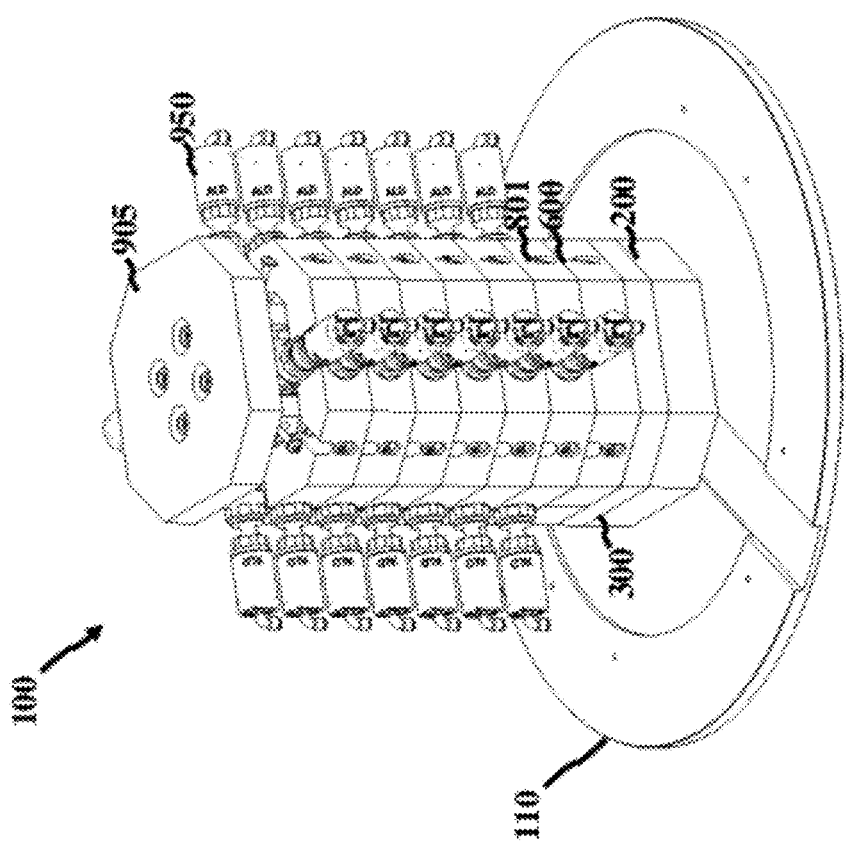
FIG. 1D illustrates a schematic diagram of a single port symmetrically divisional gas distribution apparatus according to an embodiment herein.

As shown in FIGS. 1D and 1E, and described in further detail below, single port symmetrically divisional gas distribution apparatus 100 and dual port symmetrically divisional gas distribution apparatus 150 each include a showerhead backing plate 110, an insulator plate 200, a mounting plate 300, a center purge block 600, a top cap 905 and a plurality of valves 950. In addition, single port symmetrically divisional gas distribution apparatus 100 includes a plurality of single port reactant distribution blocks 801. Furthermore, dual port symmetrically divisional gas distribution apparatus 150 includes a plurality of dual port reactant distribution blocks 802. As shown in FIGS. 1A and 1B, the dual port symmetrically divisional gas distribution apparatus 150 includes offset-aligned valves 950, whereas the single port symmetrically divisional gas distribution apparatus 100 includes aligned valves 950.

FIG. 1F, with reference to FIGS. 1A through 1E, illustrates a schematic diagram of the backing plate 110 according to an embodiment herein. As shown, backing plate 110 includes a plurality of inner mounting bolt holes 112, a stabilizing plate 114, a plurality of outer mounting bolt holes 116, an inner body 118, a notch 120, and an outer body 122. The inner body 118 and outer body 122 are separated by a step 119 such that the inner body 118 steps down from the outer body 122. The features shown in FIG. 1F enable backing plate 110 to attach securely to either single port symmetrically divisional gas distribution apparatus 100 or dual port symmetrically divisional gas distribution apparatus 150. For example, according to one embodiment herein, inner mounting bolt holes 112 include threaded mounting bosses for attachment to securing means such as bolts, screws, threaded rods etc. (not shown), which are further used to connect to the single port symmetrically divisional gas distribution apparatus 100 or dual port symmetrically divisional gas distribution apparatus 150. The backing plate 110 shown in FIG. 1F is substantially circular, although other configurations are possible. While not shown in FIG. 1F, backing plate 110 includes a number of recessed regions (e.g., inner body 118) that accepts a thin, ring-shaped, heating element used to heat backing plate 110 (e.g., to prevent the condensation of chemical vapors on its journey to the reaction region in the processing chamber, which is not shown). In addition, notch 120 allows for the electrical leads to exit out of the sandwiched parts (e.g., backing plate 110 and a thin, ring-shaped heating element). According to one embodiment herein, such electrical leads include AC power for the heater and thermocouple leads to monitor the temperature of the heating element (not shown). In addition, stabilizing plate 114 optionally provides the minimum material needed to mate with the parts on top (e.g., insulator plate 200). While not shown, according to one embodiment herein, a thin ring shaped heater (not shown) buts up against insulator plate 200 and fills the entire recessed region (e.g., inner body 118). In addition, there are holes in the ring heater (not shown) for a number (e.g., eight) small bosses to protrude through and support the weight of the components above (e.g., insulated distribution apparatus 1000) above with a wide stance.

According to one embodiment herein, inner mounting bolt holes 112 are threaded and fasteners are installed through holes 305 of mounting plate 300 that secure insulator plate 200 to backing plate 110. In addition, several O-ring seals (not shown) are compressed in the center island when all these fasteners are tightened. According to one embodiment of mounting plate 300, shown in FIG. 3A, coupling holes 305 around the perimeter of mounting plate 300 extend all the way through (e.g., to insulator plate 200), but threaded rod securing holes 310 do not extend all the way through to mounting plate 300. Thus, according to one embodiment herein, this configuration permits installing a bolt with head into through mounting plate holes 305, to secure insulator plate 200 onto backing plate 110. Moreover, the bolts heads (not shown) are recessed in the large holes around the perimeter of mounting plate 300 (e.g., coupling holes 305). According to another embodiment of the mounting plate (e.g., mounting plate 420) shown in FIG. 4A, an additional round flange is included that contains holes 425 that permit mounting the mounting plate (e.g., mounting plate 420) directly to lid 10 to help carry the load of the entire assembly (e.g., insulated distribution apparatus 1000) when lid 10 is pivoted open (e.g., using pivot arm 20) and all the weight is hanging off the side of the open lid assembly (not shown). In addition, holes 116 of backing plate 110 are an additional set of threaded features that permit securing insulator 75 (e.g., a Meldin® insulator available from Dixon Industries Corp., Bristol, R.I., U.S.A) to the backing plate 110.

Figure 2C:
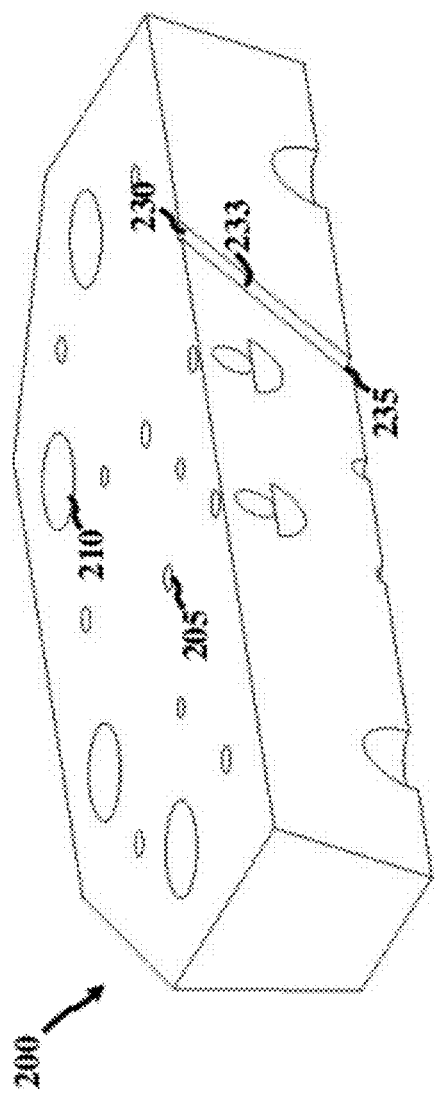
FIG. 2C illustrates a cross-sectional view of an insulator according to an embodiment herein.

FIG. 2A, with reference to FIGS. 1A through 1F, illustrates a top perspective view of the insulator plate 200 according to an embodiment herein. In addition, FIG. 2B, with reference to FIGS. 1A through 2A, illustrates a bottom perspective view of the insulator plate 200 and FIG. 2C, with reference to FIGS. 1A through 2B, illustrates a cross-sectional view of the insulator plate 200 according to an embodiment herein. According to one embodiment herein, insulator plate 200 provides electrical insulation and is optional when RF energy is used due to the nature of RF process where a showerhead (e.g., showerhead 70) is powered with RF energy. For example, insulator plate 200 prevents the RF process from shorting out to ground potential—e.g., lid 10 and insulated distribution apparatus 1000. According to one embodiment herein, insulator plate 200 would not be required when a showerhead (e.g., showerhead 70) is not electrically energized. While insulator plate 200 is shown in FIGS. 2A through 2C as an eight-sided plate, embodiments herein are not limited to the illustrated geometry, as described in further detail below. As shown, insulator plate 200 includes a plurality of gas inlets 205, a plurality of top mounting holes 210 (where each top mounting hole 210 includes a top recess 215), a plurality of bottom mounting holes 220 (where each bottom mounting hole 220 includes a bottom recess 225). In addition, as shown in FIG. 2C, each gas inlet 205 includes a top inlet 230 and a bottom inlet 235. The top and bottom inlets 230, 235 form the openings of channel 233. As shown, channel 233 including top and bottom inlets 230, 235 are angled through the body of the insulator plate 200. Insulator plate 200 provides insulation between backing plate 110 and a mounting plate (e.g., mounting plate 300, shown in FIGS. 3A and 3B). Due to the electrical potential between the two components (e.g., backing plate 110 and mounting plate 300), the insulator plate 200 provides electrical insulation to the single port symmetrically divisional gas distribution apparatus 100 or dual port symmetrically divisional gas distribution apparatus 150. The insulator plate 200 may comprise ceramic material, or other types of insulators including, but not limited to, composite polymers, porcelain, rubber, glass, reinforced plastic, etc. In addition, while not shown in FIG. 2A, one embodiment of insulator plate 200 compresses multiple O-rings between insulator plate 200 and the mounting plate (e.g., mounting plate 300, shown in FIGS. 3A and 3B). Moreover, while not shown in FIG. 2B, one embodiment of insulator plate 200 compresses multiple O-rings between insulator plate 200 and backing plate 110. For example, each top mounting hole 210 couples with an inner mounting bolt hole 112 and are coupled using attachments such as bolts, screws, threaded rods, etc. (e.g., as shown in FIG. 1C).

Figure 3B:
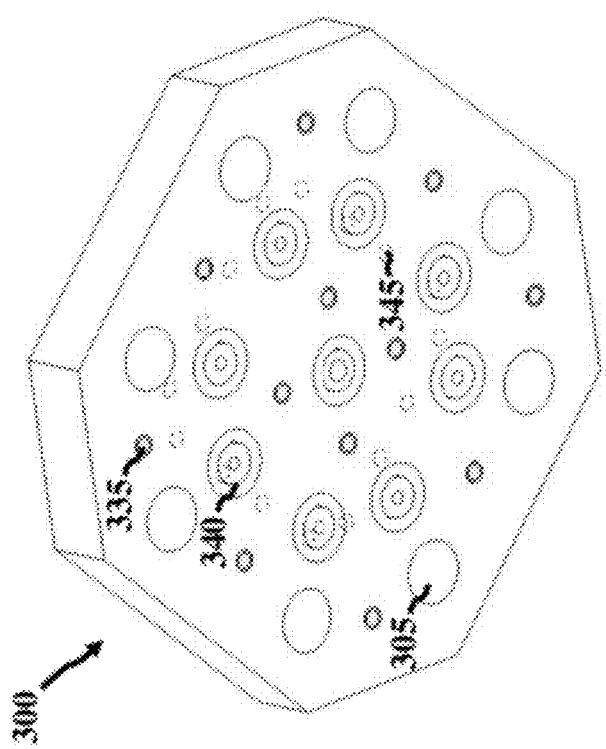
FIG. 3B illustrates bottom perspective view of a mounting plate according to an embodiment herein.
Figure 3A:
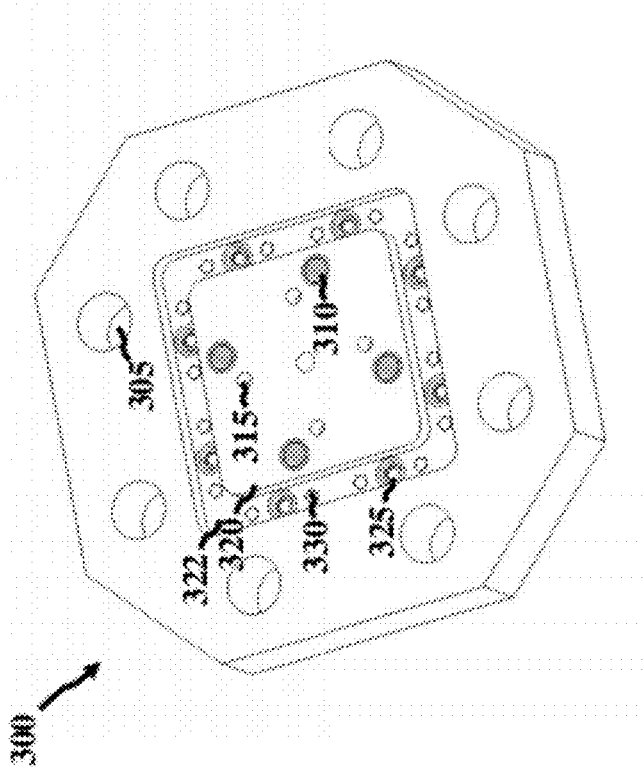
FIG. 3A illustrates top perspective view of a mounting plate according to an embodiment herein.

FIG. 3A, with reference to FIGS. 1A through 2C, illustrates a top perspective view of a mounting plate 300 according to an embodiment herein. In addition, FIG. 3B, with reference to FIGS. 1A through 3A, illustrates a bottom perspective view of the mounting plate 300 according to an embodiment herein. While mounting plate 300 is shown in FIGS. 3A through 3C as an eight-sided plate, embodiments herein are not limited to the illustrated geometry, as described in further detail below. As shown, mounting plate 300 includes a plurality of coupling holes 305, a plurality of threaded rod securing holes 310, a plurality of threaded center purge block mounting holes 315, a raised center section 320, a groove 322 surrounding raised center section 320, a plurality of gas through paths 325, and O-ring grooves 340. According to one embodiment herein, gas through paths 325 secure to a manifold (e.g., manifold 505, shown in FIGS. 5A and 5B) using W-seals, for example. The W-seals are structurally deformable and softer than the adjacent surfaces of the manifold 505 and mounting plate 300. FIG. 3B shows screw holes 335, which are threaded features used to mate insulator plate 200 to mounting plate 300 with screws (not shown) that are installed from the bottom surface of insulator plate 200 up into mounting plate 300 using holes 220. Gas inlet 345 is associated with the gas through paths 325 within the O-ring grooves 340. In FIG. 3A, gas through paths 325 are gas passages that use the W-seal. According to one embodiment herein, each of the eight gas through paths 325 with a W-seal has two threaded holes that permit the manifolds (e.g., manifold 505) that also have a mating W-seal feature to be mounted via a two screw flange (not shown). For example, according to one embodiment herein, mounting plate 300 includes eight gas through paths 325, each with a W-seal, and sixteen associated threaded holes within the rectangular groove 322 shown in FIG. 3A. According to one embodiment herein, a gas travels through a manifold (e.g., manifold 505), through the W-seal in the mounting plate 300, exits mounting plate 300 and into insulator plate 200 with an O-ring at these two plates interface, downward into backing plate 110, also using O-rings between insulator plate 200 and backing plate 110. In addition, according to one embodiment herein, since W-seals require too much force to sufficiently compress that a ceramic insulator (e.g., insulator plate 200) may not be able to withstand without fracturing. O-rings are much easier to compress and may be used instead.

Figure 4B:
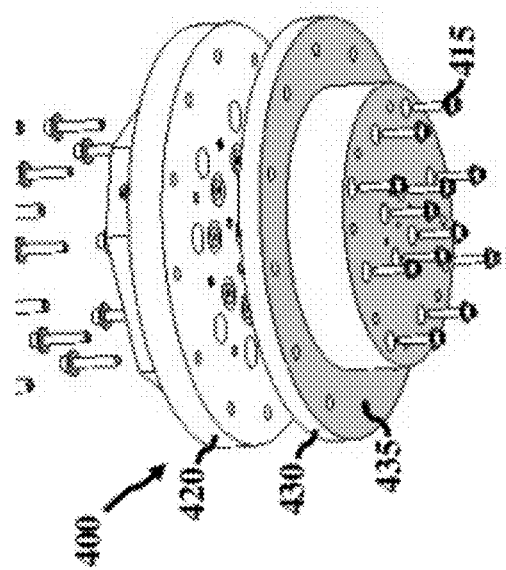
FIG. 4B illustrates a bottom exploded view of an insulator/mounting plate sub-assembly according to an embodiment herein.
Figure 4A:
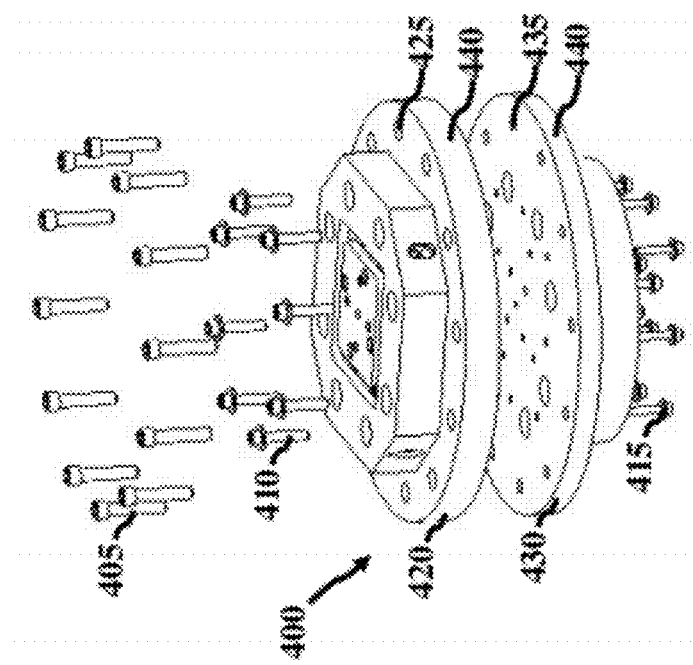
FIG. 4A illustrates a top exploded view of an insulator/mounting plate sub-assembly according to an embodiment herein.

FIG. 4A, with reference to FIGS. 1A through 3B, illustrates a top exploded view of an insulator/mounting plate sub-assembly according to an embodiment herein. In addition, FIG. 4B, with reference to FIGS. 1A through 4A, illustrates a bottom exploded view of an insulator/mounting plate sub-assembly according to an embodiment herein. FIG. 4C, with reference to FIGS. 1A through 4B, illustrates a schematic diagram of the insulator/mounting plate sub-assembly according to an embodiment herein. As shown, insulator/mounting plate sub-assembly includes a plurality of outer mounting screws 405, a plurality of inner mounting screws 410, a plurality of bottom screws 415, a flanged mounting plate 420, a plurality of mounting plate outer holes 425, a flanged insulator plate 430, and a plurality of insulator plate inner holes 435. As described above, flanged mounting plate 420 and flanged insulator plate 430 are alternative embodiments (e.g., alternative geometries) of mounting plate 300 and insulator plate 200. Flanged mounting plate 420 and flanged insulator plate 430 each benefit from a flange 440 to help distribute a weight each component may bear—for example the weight of insulated distribution apparatus 1000 (as shown in FIG. 1C). While not shown, flanged mounting plate 420 also includes a plurality of mounting plate inner holes and insulator plate 430 includes a plurality of threaded insulator plate outer holes. When assembled (as shown in FIG. 4C), outer mounting screws 405, inner mounting screws 410, and bottom screws 415 of insulator/mounting plate sub-assembly 400 ensures flanged mounting plate 420 and flanged insulator plate 430 are securely coupled. In addition, mounting screws 405 are used to secure insulator/mounting plate sub-assembly to lid 10 to realize the weight distribution benefits as described above. Moreover, while not shown, screws 405 extend into the lid according to one embodiment herein.

FIG. 5A, with reference to FIGS. 1A through 4C, illustrates a view of a manifold and mounting plate sub-assembly 500 according to an embodiment herein. In addition, FIG. 5B, with reference to FIGS. 1A through 5A, illustrates a view of a manifold and mounting plate sub-assembly 500 with a center purge block 600 according to an embodiment herein. As shown, a plurality of manifolds 505 are coupled to mounting plate 300. In particular, according to the embodiment shown, four manifolds 505 are coupled to mounting plate 300—where one manifold 505 is secured to a corner of mounting plate 300. In addition, each manifold 505 is shown with a plurality of ports 510 and junctions 515. While not shown, according to one embodiment herein, manifold 505 is a singular component that does not show any segmented nature. Moreover, different sized manifolds (e.g., manifolds 505) may be used depending on the assembly required, such as in the dual port configuration, where the manifolds used are five port and three port for outlets one and two, respectively.

In addition, as shown in FIG. 5B, manifolds 505 are also loosely coupled to a center purge block 600 via manifold notches 675. While not shown in FIG. 5B, according to one embodiment herein, four screws bolt the center purge block 600 and O-ring to mounting plate 300. FIG. 6A, with reference to FIGS. 1A through 5B, illustrates a top view of a center purge block 600 according to an embodiment herein. In addition, FIG. 6B, with reference to FIGS. 1A through 6A, illustrates a bottom perspective view of the center purge block 600 according to an embodiment herein. As shown, center purge block 600 includes a center passage 635 (and is surrounded by an O-ring groove 640), a plurality of securing holes 605 with counter-bores 610, and a plurality of manifold notches 675. The notches 675 are configured to align with the manifolds 505 as shown in FIG. 5B. In addition, as shown in FIG. 6B, center purge block 600 includes a first inlet hole 620, a second threaded inlet hole 625, a third inlet hole 630 to receive a cartridge heater, a fourth inlet hole 660 to receive a thermocouple, a fifth threaded inlet hole 665, and a sixth inlet hole 670 to receive a cartridge heaters. In addition, while not shown, inlet holes 660, 665 and 670 are also present on the remaining two corners not visible. According to one embodiment herein, center purge block 600 further includes an array of sixteen inlet holes 645 on the bottom side of the block that receives the protruding heads of the securing screws (not shown) used to mount manifolds 505 to mounting block 300. According to one embodiment herein, such holes merely provide clearance for the screw heads.

According to one embodiment herein, center purge block 600 routes an inert gas, typically argon, to a central region in a showerhead (e.g., showerhead 70). This gas is then distributed in a cross pattern in the showerhead to provide, for example, quadrant isolation in semiconductor processing. According to such an embodiment, such an inert gas is always present while other gases that comprise each remaining quadrant of a combinatorial process may change depending on the process. Therefore, according to one embodiment herein, center purge block 600 is a simple distribution block and located at the base of insulated distribution apparatus 1000. Gas goes in port 620, then makes a right turn down and exits into center passage 635 that extends through insulator plate 200, backing plate 110, and is deposited into the center of the showerhead, e.g., where it is distributed in a "+" pattern. According to one embodiment herein, third inlet hole 630 is the same as sixth inlet hole 670, and there are four in total. These inlet holes receive cartridge heaters (e.g., heater blocks 1005, shown in FIG. 10B). In addition, according to one embodiment herein, second threaded inlet hole 625 is the same as the fifth threaded inlet hole 665, and both are threaded to receive a screw (not shown) that attaches heater blocks (e.g., heater blocks 1005) and special shaped washer that also retains the cartridge heaters. Moreover, according to one embodiment herein, there are four such arrangements around center purge block 600. According to one embodiment herein, fourth inlet hole 660 receives a thermocouple (not shown) to monitor the temperature of center purge block 600. Holes 615 in the top view are through holes that a threaded rod (e.g., threaded rod 910, shown in FIG. 9B) passes through as the threaded rod is secured in mounting plate 300. As discussed in further detail below, all the blocks in insulated distribution apparatus 1000 have through holes a threaded rod (e.g., threaded rod 910, shown in FIG. 9B) to pass through. In addition, according to one embodiment herein, fifth threaded holes 645 are approximately ¼ inch deep, and provide for clearance for other screws that attach a manifold (e.g., manifolds 505) to mounting plate 300. The plurality of notches 675 provide clearance for manifold tubing (e.g., manifold 505). According to one embodiment herein, most, if not all of the features and holes, described above are also present in the distribution reactant block 800 shown in FIG. 8A. For example, in FIG. 8A, holes 875 and 820 are the same as holes 630 and 670, receiving cartridge heaters (e.g., heater blocks 1005). In addition, according to one embodiment herein, holes 870, 815 and 625 and 665 are all the same threaded hole to receive securing screw for heater blocks. Moreover, according to one embodiment herein, holes 660 and 810 are the same, receiving a thermocouple. According to one embodiment herein, inlet hole 620 does the same as hole 865; as described in further detail below, however, the internal distribution is much more complicated in distribution reactant block 800 than center purge block 600.

Figure 7:
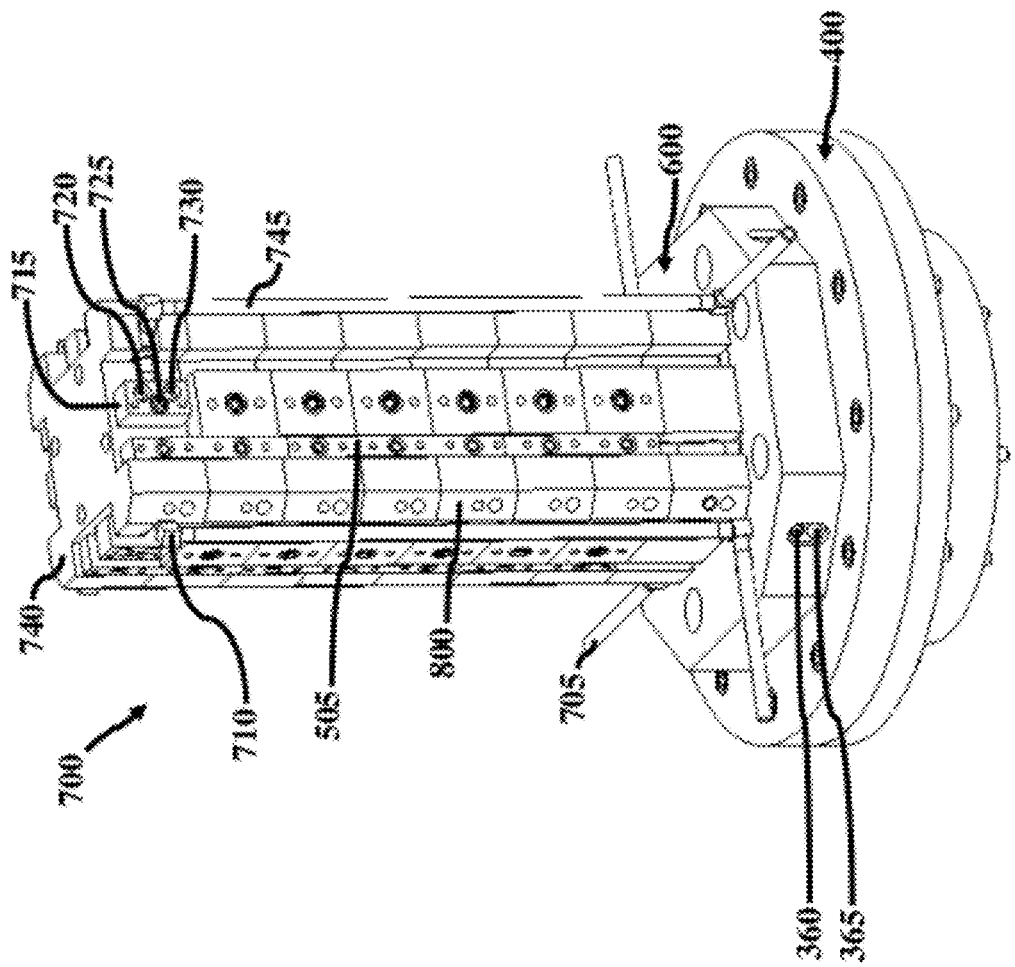
FIG. 7 illustrates a schematic diagram of a distribution stack sub-assembly according to an embodiment herein.

FIG. 7, with reference to FIGS. 1A through 6B, illustrates a schematic diagram of a distribution stack sub-assembly 700 according to an embodiment herein. As shown in FIG. 7, distribution stack sub-assembly 700 includes an insulator and mounting plate sub-assembly 400, a plurality of manifolds 505, a center purge block 600, flanged mounting plate 420, first inlet 360 hole (e.g., to receive cartridge heaters and securing screws, as well as a thermocouple—that is first inlet hole 360 is a threaded hole that a screw (not shown) with retainer washer is installed within to secure a cartridge heater), second inlet hole 365 (e.g., according to one embodiment herein, is a hole to receive a cartridge heater and, while not shown, there are four second inlet 365 around mounting plate 420), and a plurality of reactant distribution blocks 800. FIG. 7 also illustrates a plurality of gas delivery lines 705, gas delivery elbow joints 710, gas deliver junction box 715, a first gas deliver junction box inlet 720, a second gas deliver junction box inlet 725, and a third gas deliver junction box inlet 730.

According to one embodiment herein, gas delivery lines 705, gas delivery elbow joints 710, and gas deliver junction box 715 are all major parts of a quadrant purge distribution manifold 745—where gas deliver junction box 715 includes a W-seal block that mates with a valve (as described below). In addition, second gas deliver junction box inlet 725 is a gas feed hole within gas deliver junction box 715 surrounded by a W-seal. Inlets 720 and 730 are holes to receive mounting screws (not shown) to secure gas delivery junction box 715 to a quadrant purge mounting block 740. As shown in FIG. 9A, a valve (e.g., valve 950) will straddle gas deliver junction box 715 and manifold 505. Also shown in FIG. 7 is a quadrant purge mounting block 740 that has features similar to other blocks in distribution stack sub-assembly 700 (e.g., couplings for heaters, thermocouples, and mounting screws—as discussed below in FIGS. 10A through 11C). In addition, quadrant purge mounting block 740 is coupled to quadrant purge distribution manifold 745 and is used to mount quadrant purge manifold 745 in the proper location to mate to manifold 505. The quadrant purge mounting block 740 and quadrant purge manifold 745 combination provides a quadrant purge function that includes using an inert gas to clear out internal passages after a reactant dose has been completed. For example, according to one embodiment herein, a reactant is exposed for a given time, then a purging gas is run through the line out to push all the material out for a sharp change in composition in the process chamber (not shown), in order to bring the next reactant in. According to one embodiment herein, without purging, there would be residual first reactant that could react with the second creating particles that would be considered contamination of the deposited species. According to one embodiment herein, a dual port embodiment (described below) separates the potentially reacting materials until they reach the process chamber, and by not sharing any delivery passages, a dual port embodiment overcomes the potential to contamination the deposited species. According to one embodiment herein, a single port embodiment includes purge times that are greatly exaggerated because the materials may not clear out due to their being "sticky"—i.e., not longer a vapor. Therefore, according to one embodiment herein, a feature of the quadrant purge function of quadrant purge mounting block 740 is that each quadrant of a showerhead (e.g., showerhead 70) has its own discrete delivery line (e.g., via quadrant purge manifold 745) to deliver the purge gas to each quadrant separately. Consequently, according to one embodiment herein, quadrant purge mounting block 740 does not have the same internal geometry a reactant block (e.g., distribution reactant block 800 shown in FIG. 8A). For example, according to one embodiment herein, all that is needed in quadrant purge mounting block 740 is a binary switch turn on or off the flow of purge gas. Therefore, according to one embodiment herein, quadrant purge mounting block 740 does not need to be divided between quadrants since each quadrant has its own dedicate quadrant purge delivery channel (not shown). The reactants, however, are divided up from the single inlet (e.g., inlet 865, shown in FIG. 8A) in the reactant block into however many quadrants are desired via the recipe control of the valves (not shown).

FIG. 8A, with reference to FIGS. 1A through 7, illustrates a top perspective view of a reactant distribution block 800 according to an embodiment herein. In addition, FIG. 8B, with reference to FIGS. 1A through 8A, illustrates a transparent top perspective view of the reactant distribution block 800, and FIG. 8C, with reference to FIGS. 1A through 8B, illustrates a cross-sectional view of the reactant distribution block 800 according to an embodiment herein. According to the embodiment shown, reactant distribution block 800 includes a plugged and welded bottom side 805, a hole for a thermocouple 810, a plurality of threaded holes (e.g., 815 and 870), a first threaded hole 825, a gas outlet 830, a W-seal groove 835, a second threaded hole 840, an intersecting passage 845, a plurality of manifold notches 850, a plurality of top ports 855, an inner metering plug 860, a gas inlet 865, and a plurality of cartridge heater holes (e.g., 875 and 820).

Threaded holes to mount valves are indicated at threaded holes 825, 840, and include top and bottom screw locations. Threaded holes for heater block attachment are shown as threaded holes 870, 815, and 885—where, according to one embodiment herein, they are of similar dimensions. Holes to receive cartridge heaters include cartridge heater holes 875, 820, and 880—where, according to one embodiment herein, are of similar dimensions. In addition, gas inlet 865 protrudes to center of reactant distribution block 800. According to one embodiment herein, an intersecting passage 845 is drilled up through the bottom and into gas inlet 865. In addition, one embodiment herein employs four distribution passages 830 that are situated around reactant distribution block 800 and exit at each of four surfaces shown with a surrounding W-seal feature 835. While the embodiment of reactant distribution block 800 shown in FIGS. 8A through 8I include four distribution passages and four exiting surfaces, the embodiment herein are not limited to such a configuration. For example, while not shown, embodiments herein include eight exiting surfaces, with a single distribution passage for exiting to each surface, and eight distribution passages exiting four distribution surfaces.

According to one embodiment herein, inner metering plug 860 includes a metering and distribution plug welded in after the drilling is complete to enclose the distribution passages entirely within reactant distribution block 800. Moreover, according to one embodiment herein, a critical function of inner metering plug 860, according to its structural design, is to alter the incoming gas flow properties (e.g., momentum) so that in a transient burst of gas delivery, the gas does not favor any of the four possible routes exiting reactant distribution block 800 (and towards the subsequent valve and manifold). Since gas comes in via gas inlet 865, if all four valves were open and inner metering plug 860 was not present, the gas would preferentially exit at the two outlets opposite the inlet. Therefore, according to one embodiment herein, metering and distribution plug feature of inner metering plug 860 is structured to cause the gas to travel first upwards near the top of the bore 865, then turn down into central axis 880 of inner metering plug 860, where the four outlets in inner metering plug 860 create enough restriction to balance the gas to flow to all four of the possible outlet routes.

The structure of inner metering plug 860 permits these benefits without increasing the internal pressure, which, according to one embodiment herein, is a deterrent to an upstream apparatus (not shown) where materials in liquid form are being turned into vapor. Since factors to turn a liquid (or solid) into vapor include raising the temperature and decreasing the local pressure, embodiment herein optimally balances these factors. For example, according to embodiments herein, while increasing the temperature is acceptable, increasing the temperature leads to the thermal degradation of the precursor. Therefore, it may be desirable to optimize this factor. For example, according to embodiments herein, insulated distribution apparatus 1000 is both heat and insulated to maintain the optimal temperature for a vapor and avoid introducing cold spots during the distribution of that vapor, which can cause uncontrolled sinks (e.g., condensation) of material. Therefore, embodiments herein provide optimal control of heat to minimize the chance of cold spots arising. In addition, embodiments herein (e.g., inner metering plug 860) optimize pressure. For example, the restriction between a vapor generation device (e.g., a bubbler, not shown) and the process chamber can lead to increasing pressure that can lead to vapor condensing out onto surfaces. As discussed above, inner metering plug 860 optimizes the distribution of a vapor without adding back pressure—since the introduction of back pressure can lead to condensation. Therefore, the structure of inner metering plug 860 shown provides adequate control to the gas flow without excessive back pressure that would impact a process window.

Figure 8E:
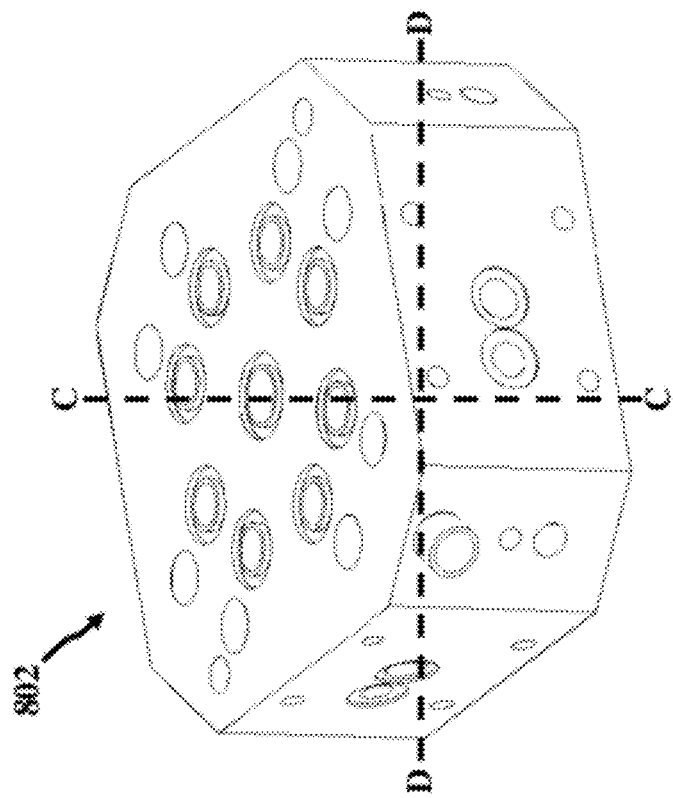
FIG. 8E illustrates a top perspective view of a dual port reactant distribution block according to an embodiment herein.
Figure 8D:
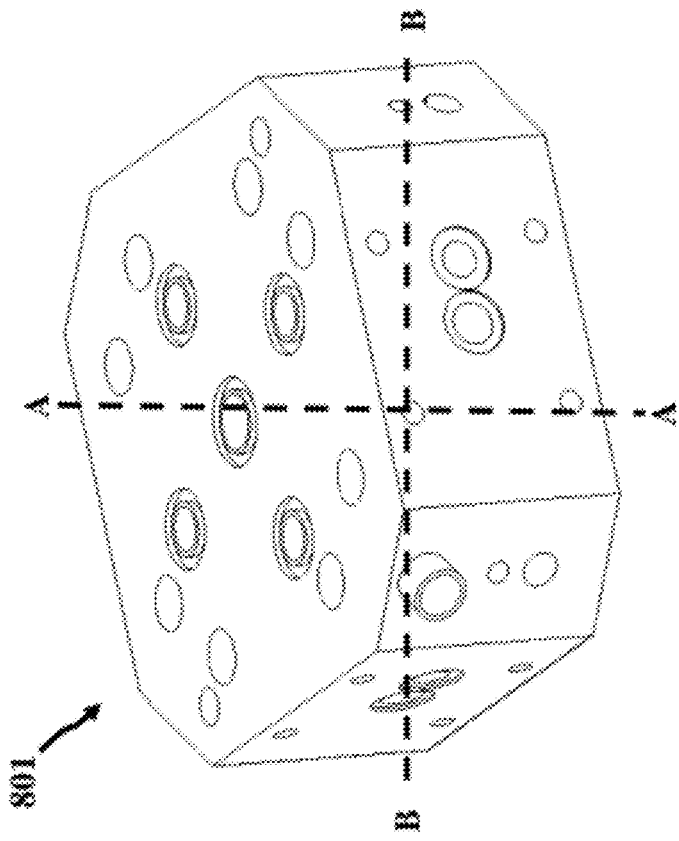
FIG. 8D illustrates a top perspective view of a single port reactant distribution block according to an embodiment herein.
Figure 8F:
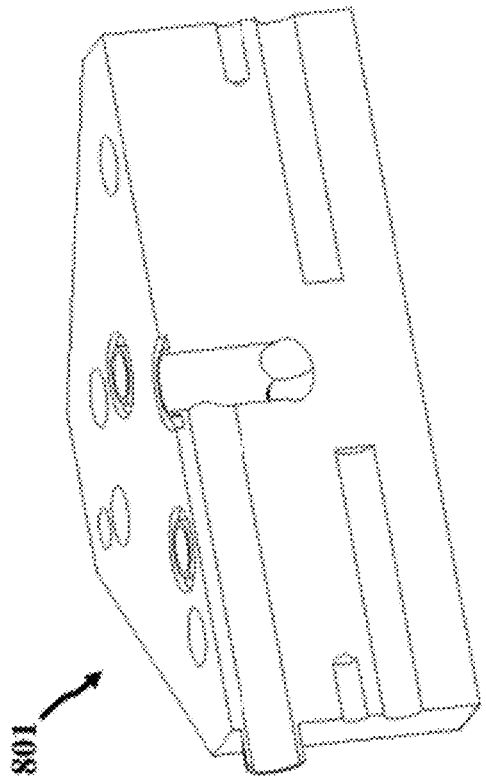
FIG. 8F illustrates a cross-sectional view along the A-A axis shown in FIG. 8D of a single port reactant distribution block according to an embodiment herein.
Figure 8G:
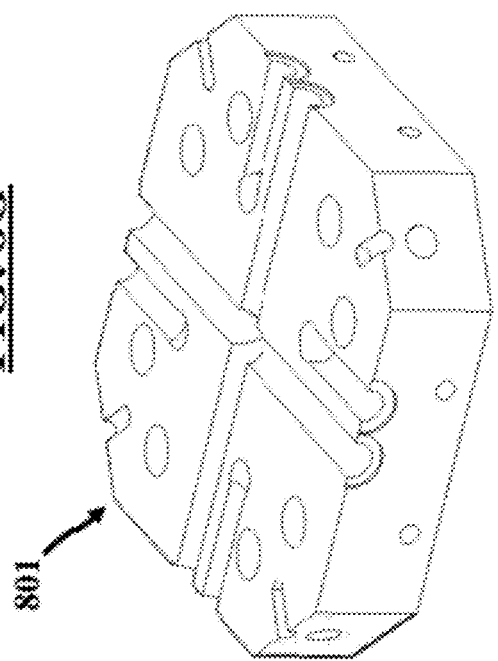
FIG. 8G illustrates a cross-sectional view along the B-B axis shown in FIG. 8D of a single port reactant distribution block according to an embodiment herein.

FIG. 8D, with reference to FIGS. 1A through 8C, illustrates a top perspective view of a single port reactant distribution block 801, while FIG. 8E, with reference to FIGS. 1A through 8D, illustrates a top perspective view of a dual port reactant distribution block 802 according to an embodiment herein. In addition, FIG. 8F, with reference to FIGS. 1A through 8E, illustrates a cross-sectional view along the A-A axis shown in FIG. 8D of the single port reactant distribution block 801 and FIG. 8G, with reference to FIGS. 1A through 8F, illustrates a cross-sectional view along the B-B axis shown in FIG. 8D of the single port reactant distribution block 801 according to an embodiment herein. Moreover, FIG. 8H, with reference to FIGS. 1A through 8G, illustrates a cross-sectional view along the C-C axis shown in FIG. 8E of the dual port reactant distribution block 802 and FIG. 8I, with reference to FIGS. 1A through 8H, illustrates a cross-sectional view along the D-D axis shown in FIG. 8E of the dual port reactant distribution block 802 according to an embodiment herein.

Figure 8I:
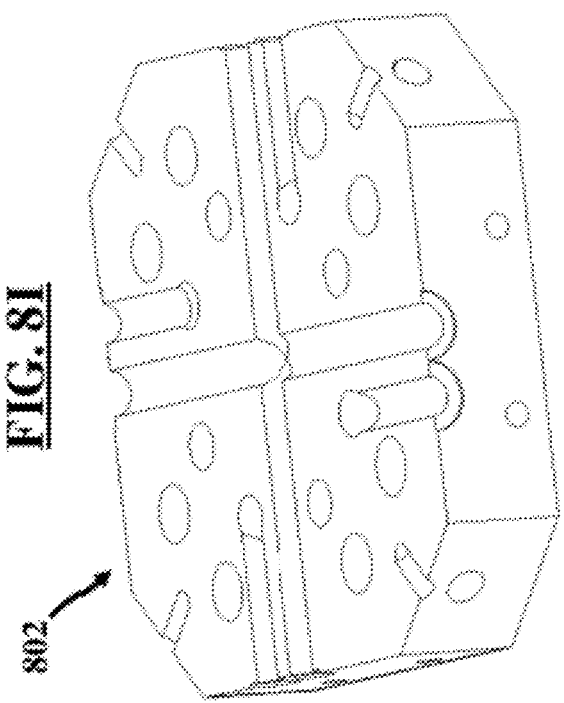
FIG. 8I illustrates a cross-sectional view along the D-D axis shown in FIG. 8E of a dual port reactant distribution block according to an embodiment herein.
Figure 8H:
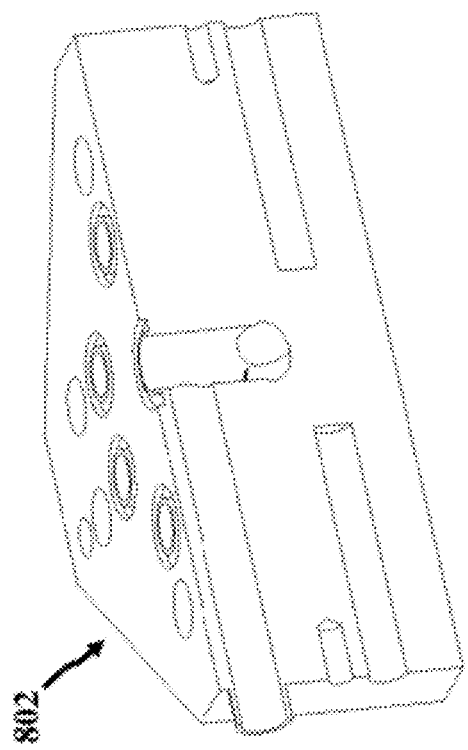
FIG. 8H illustrates a cross-sectional view along the C-C axis shown in FIG. 8E of a dual port reactant distribution block according to an embodiment herein.

As discussed above, FIGS. 8D, 8F and 8G show a single port embodiment, wherein functions of manifolds 505 are integrated into distribution block 801, and do so with much larger cross sectional area than manifolds 505 offer. According to one embodiment herein, using distribution block 801, the number of gasses supported is merely a function of how many blocks are stacked atop each other as the manifold post valve is integrated into distribution block 801. FIGS. 8E, 8H, and 8I show a dual ported distribution block 802 that is, according to one embodiment herein, similar to distribution block 801 with the addition of a second alternate path formed by rotating the valve features 180 degrees (not shown). This provides for a second path through the stack of dual ported distribution block 802 as an alternate route downwards. In addition, dual ported distribution block 802 supports a through path that mates up with a first path in distribution block 801. Therefore, by using a plurality of distribution blocks 802 in a lower region of a stack (e.g., as shown in dual port symmetrically divisional gas distribution apparatus 150) connected to a plurality of distribution blocks 801 in an upper region of a stack (e.g., as shown in dual port symmetrically divisional gas distribution apparatus 150), gases involved in the through manifold of distribution block 801 continue through the stack (e.g., as shown in dual port symmetrically divisional gas distribution apparatus 150) through the lower distribution 802 blocks unaffected. In addition, a second gas (or gases) can be introduced in the lower distribution blocks 802 in the stack (e.g., as shown in dual port symmetrically divisional gas distribution apparatus 150) into the second separate set of four manifold passages downwards through the blocks. The result is two separate gas paths into each quadrant, each of large cross section for high conductance for minimum effect on back pressure, as discussed above.

FIG. 9A, with reference to FIGS. 1A through 8I, illustrates a secured distribution stack sub-assembly 900 with valves 950 according to an embodiment herein. In addition, FIG. 9B, with reference to FIGS. 1A through 9A, illustrates an exploded view of a secured distribution stack sub-assembly 900 with valves 950 according to an embodiment herein. In particular, FIG. 9A shows a secured distribution stack sub-assembly 900, which includes a distribution stack sub-assembly 700 with a plurality of valves 950 attached thereto. In FIG. 9B, secured distribution stack sub-assembly 900 includes a top cap 905, a plurality of securing rods 910 and securing nuts 915. Top cap 905 and distribution stack sub-assembly 700 are held together via securing rods 910 and securing nuts 915 (e.g., four securing rods 910, which are at least partially threaded and four securing nuts 915, according to one embodiment) to form secured distribution stack sub-assembly 900. Although threaded rods 910 are shown in FIG. 9B, embodiments herein include any means to secure one block tightly to the next block (e.g., a coupling mechanism). For example, one embodiment herein includes each block being screwed down to the succeeding block in the stack and thereby building the stack one layer at time.

FIG. 9C, with reference to FIGS. 1A through 9B, illustrates a schematic diagram of valves 950a, 950b according to an embodiment herein. As shown in FIG. 9C, valve 950a includes a first body 955, a second body 960, a third body 965, and a port 970. Valve 950b also includes a first body 955 and a second body 960. In addition, according to one embodiment herein, valve 950b also has the equivalent of a third body 965. In addition, FIG. 9D, with reference to FIGS. 1A through 9C, illustrates a schematic diagram of valve mounting plates 975a and 975b, according to an embodiment herein. As shown in FIG. 9D, valve mounting plate 975a is coupled to valve 950a and includes a four anchoring holes 980 and a plurality of first ports 985. Moreover, valve mounting plate 975b couples to valve 950b and includes an array of anchoring holes 990 and a plurality of second ports 995. According to one embodiment herein, both of valves minimizes the functioning time while remaining operated by pressurized air. Valve 950a is based on the W-seal format with geometry following, for example, SEMI guidelines (i.e., SEMI Global Headquarters, San Jose, Calif., USA). For example, the W-seal format uses porting diameters that are small in cross section. In addition, according to on embodiment herein, valves 950b is based on the "C-seal" format, which includes a larger valve body and larger porting within the valve (i.e., when compared to valve 950a). As shown in FIG. 9D, the W-seal of valve 950a has the two ports 985 (e.g., an inlet and outlet port) mirrored around a center plane through the valve (as shown in 975a). In contrast, the C-seal of valve 950b uses a first port 995 located on the centerline of the valve, and the second port 995 offset to one side (as shown in 975b). According to one embodiment herein, valve body 955 of valve 950a, when used in a two port configuration, translates in connecting between the center inlet port (not shown) in the gas delivery block (e.g., distribution block 802) and the connection to either first or second manifold block 505 depending on which of two ports it would feed. Valve 950b, on the other hand, rotates around a center port (not shown), so when feeding either port leading to internal manifold in distribution block 801 and distribution block 802, the valve does not translate across the stack of block, but rotates in place.

Figure 10B:
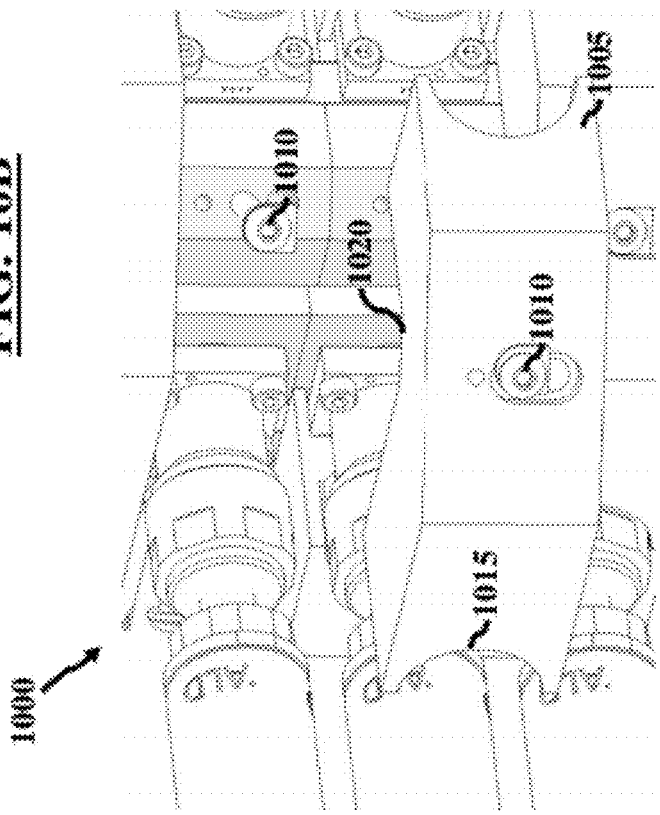
FIG. 10B illustrates a schematic diagram of a heater block according to an embodiment herein.
Figure 10A:
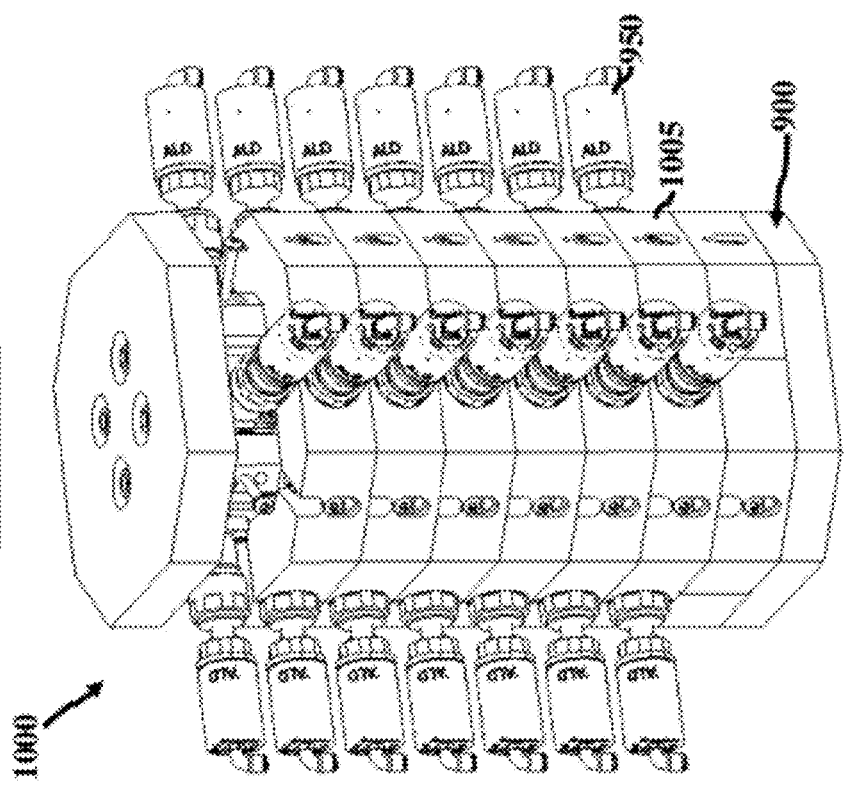
FIG. 10A illustrates a schematic diagram of a secured distribution stack apparatus with valves and additional heater blocks according to an embodiment herein.
Figure 10C:
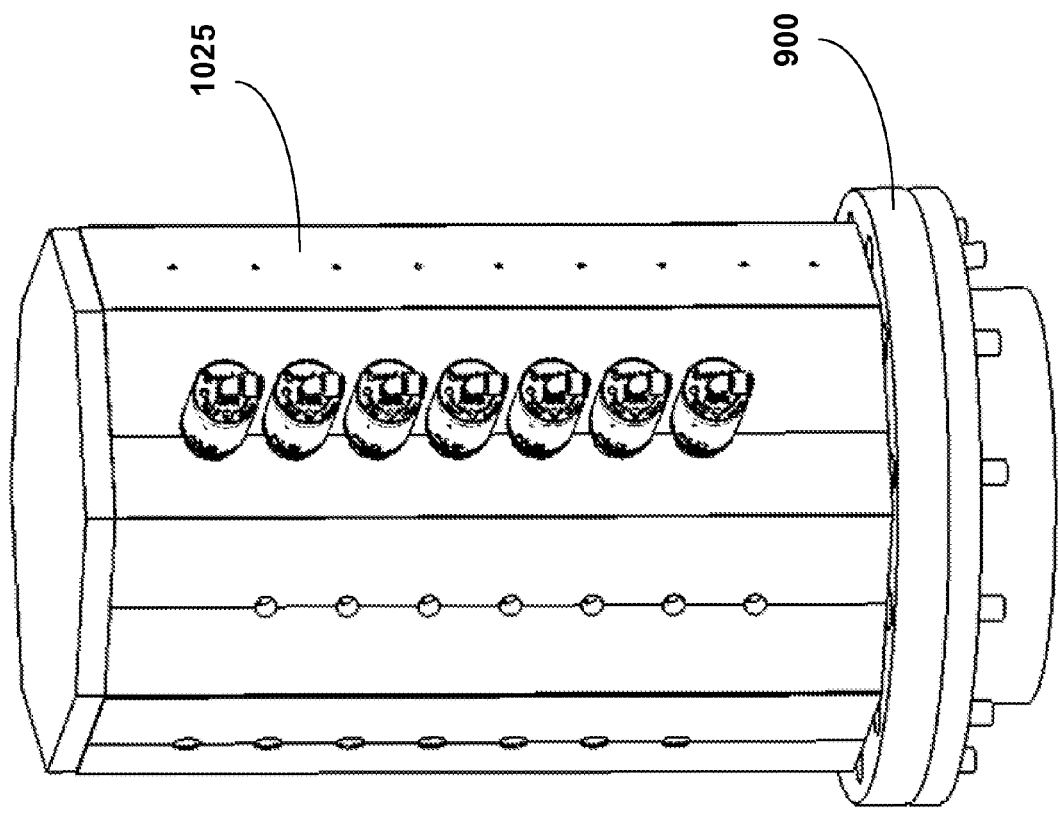
FIG. 10C illustrates a schematic diagram of an insulated distribution apparatus according to an embodiment herein.

FIG. 10A, with reference to FIGS. 1A through 9D, illustrates a schematic diagram of a nearly completed distribution apparatus 1000, which includes a secured distribution stack sub-assembly 900 with valves 950 and heater blocks 1005 according to an embodiment herein. As shown, coupled to secured distribution stack sub-assembly 900 are a plurality of heater blocks 1005. FIG. 10B, with reference to FIGS. 1A through 10A, illustrates a schematic diagram of a heater block 1005 according to an embodiment herein. As shown in FIG. 10B, heater block 1005 includes a threaded screw 1010, a curved valve coupling 1015, and an inner surface 1020—where, according to one embodiment herein, the inner surface 1020 conforms to the shape of secured distribution stack sub-assembly 900. In addition, FIG. 10C, with reference to FIGS. 1A through 10B, illustrates a schematic diagram of insulated distribution apparatus 1000 that includes a secured distribution stack sub-assembly 900 with valves 950, heater blocks 1005, and insulation jacket 1025 according to an embodiment herein. As shown, insulation jacket 1025 wraps around secured distribution stack sub-assembly 900 to protect it from an extreme temperature differential (i.e., between secured distribution stack sub-assembly 900 and its operating environment).

Figure 11A:
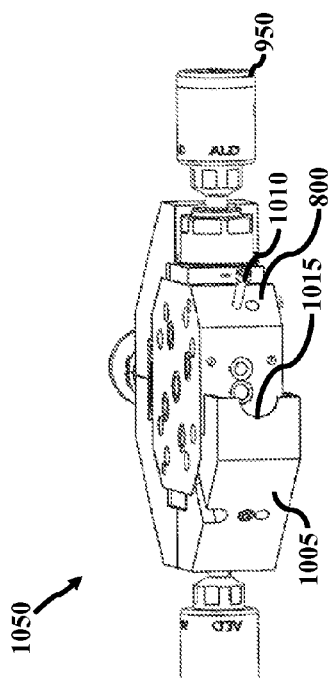
FIG. 11A illustrates a schematic diagram of a reactant distribution block sub-assembly according to an embodiment herein.
Figure 11C:
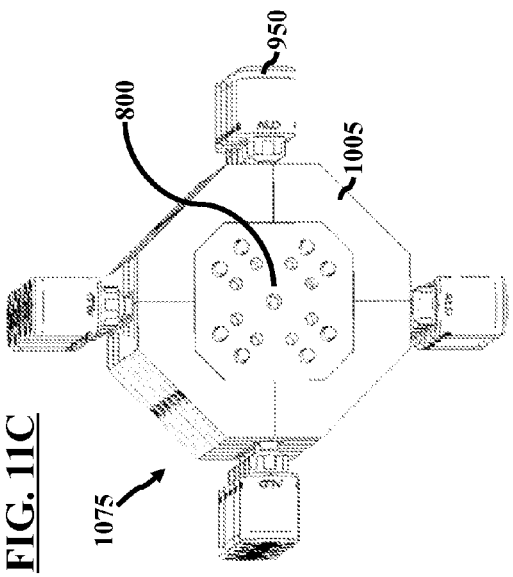
FIG. 11C illustrates a bottom perspective view of a reactant distribution block stack sub-assembly according to an embodiment herein.
Figure 11B:
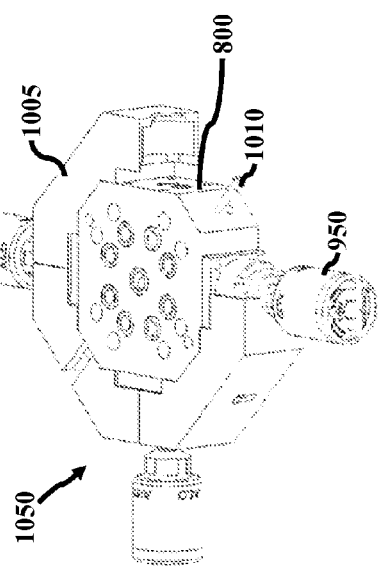
FIG. 11B illustrates a top perspective view of a reactant distribution block sub-assembly according to an embodiment herein.

FIG. 11A, with reference to FIGS. 1A through 10C, illustrates a schematic diagram of a reactant distribution block sub-assembly 1050 according to an embodiment herein. In addition, FIG. 11B, with reference to FIGS. 1A through 11A, illustrates a top perspective view of a reactant distribution block sub-assembly 1050 and FIG. 11C, with reference to FIGS. 1A through 11B, illustrates a bottom perspective view of a reactant distribution block stack sub-assembly 1075 according to an embodiment herein. As shown, reactant distribution block sub-assembly 1050 includes a reactant distribution block 800 and a plurality of valves 950 coupled thereto. In addition, reactant distribution block 800 is surrounded by heater blocks 1005, coupled to valves 950 via curved coupling 1015, and each heater block 1005 is coupled to reactant distribution block 800 via screw 1010. As shown in FIG. 11C, a stack of reactant distribution block sub-assemblies 1050 combine to form a reactant distribution block stack 1075.

FIG. 12, with reference to FIGS. 1A through 11C, illustrates a flow diagram according to an embodiment herein. As shown in the method of FIG. 12, step 1300 includes introducing gas in a reactant distribution block having first and second opposed sides with a plurality of throughways extending between the first and the second opposed sides. Furthermore, step 1302 includes transmitting the gas through a vertical channel bored within the reactant distribution block, wherein the vertical channel is centrally located within the reactant distribution block. Next, the method of FIG. 12 symmetrically and divisionally distributes the gas between the throughways using an inner metering plug coupled to the vertical channel.

As described above, the embodiments herein also a symmetrical distribution pattern with metering apparatus (e.g., inner metering plug 860) and method to reduce gas momentum effects of single inlet. For example, according to one embodiment herein, two discretely independent gas paths (per quadrant or N-divisions used) prevent pre-reaction of chemistry within delivery plumbing. In general, a modular design permits stacking of manifolds to support 1-N number of discrete input gases. Moreover, each gas can be routed to one of two separate paths to the quadrant. The symmetrically radial design according to one embodiment herein converts large number of individually designed gas line heater jackets on gas lines to simple, cheaper cartridge heaters (e.g., heater blocks 1005) embedded within manifold blocks (e.g., reactant distribution block 800), improving reliability and thermal uniformity. Moreover, according to embodiments herein, high temperature valves (e.g., valve 950) are oriented symmetrically permitting optimum cooling of valve actuators.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of different embodiments, those skilled in the art will recognize that the embodiments herein can be practiced with modification within the spirit and scope of the appended claims.

What is claimed is:

1. A system for distributing materials in a semiconductor processing chamber, said system comprising:
   a mounting plate comprising a plurality of threaded mounting plate outer holes and a plurality of mounting plate inner holes;
   a plurality of manifolds coupled to said mounting plate;
   a center purge block coupled to said mounting plate and said plurality of manifolds;
   a plurality of reactant distribution blocks, wherein the plurality of reactant distribution blocks are stacked to form a reactant distribution block stack, wherein said reactant distribution block stack sits atop said center purge block;
   a coupling mechanism to secure said plurality of reactant distribution blocks of said reactant distribution block stack together; and
   a top cap coupled to said reactant distribution block stack and said coupling mechanism.

2. The system of claim 1, wherein each reactant distribution block comprises a plurality of valves.

3. The system of claim 2, wherein each reactant distribution block comprises a plurality of heater blocks.

4. The system of claim 3, wherein each reactant distribution block is coupled to a common gas delivery line.

5. The system of claim 4, wherein said plurality of valves for each reactant distribution block comprises at least four valves;
   wherein said plurality of heater blocks for each reactant distribution block comprises at least four heater blocks; and
   wherein a total number of said valves is equal to a total number of said heater blocks.

6. The system of claim 5, further comprising an insulation jacket, wherein said insulation jacket wraps around said reactant distribution block stack and said top cap.

7. The system of claim 1,
   wherein said reactant distribution block stack further comprises at least four manifold notches configured into separate sides of said reactant distribution block stack; and
   wherein said plurality of manifolds comprises at least four manifolds and each manifold is coupled to a manifold notch.

8. The system of claim 1, wherein said coupling mechanism comprises at least four securing rods and each securing rod is coupled along a longitudinal axis of said reactant distribution block stack.

9. The system of claim 1, further comprising a backing plate coupled to said mounting plate, said backing plate comprising a plurality of mounting bolts, and each mounting bolt is securely coupled to a single mounting plate inner hole.

10. The system of claim 9, further comprising:
    a lid coupled to said mounting plate; and
    a showerhead coupled to said backing plate.

11. The system of claim 10, wherein said lid further comprises:
    a first insulator ring;
    a second insulator ring coupled to said first insulator ring; and
    an outer ring coupled to said first insulator ring, said second insulator ring, and said lid.

12. The system of claim 11, further comprising an insulator/mounting plate sub-assembly comprising:
    said mounting plate; and
    an insulator plate comprising a plurality of threaded insulator plate outer holes and a plurality of insulator plate inner holes,
    wherein said mounting plate is securely coupled to said insulator plate through a plurality of outer mounting screws mating with said plurality of threaded mounting plate outer holes and said insulator plate outer holes.

13. The system of claim 1, wherein said reactant distribution block stack comprises a first sub-stack and a second sub-stack, wherein said first sub-stack comprises at least one of a first sub-stack single port reactant distribution block and a first sub-stack dual port reactant distribution block, and wherein said second sub-stack comprises at least one of a second sub-stack single port reactant distribution block and a second sub-stack dual port reactant distribution block.

* * * * *